US012677538B2

(12) United States Patent
Sohn et al.

(10) Patent No.: US 12,677,538 B2
(45) Date of Patent: Jul. 7, 2026

(54) DISPLAY DEVICE COMPRISING A METAL OXIDE PATTERN AND METHOD FOR MANUFACTURING THE SAME

(71) Applicant: Samsung Display Co., Ltd., Yongin-si (KR)

(72) Inventors: Sangwoo Sohn, Yongin-si (KR); Yeon Keon Moon, Hwaseong-si (KR); Eun Hyun Kim, Suwon-si (KR); Seungho Yang, Hwaseong-si (KR); Jun Hyung Lim, Seoul (KR); Hyunjun Jeong, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 578 days.

(21) Appl. No.: 18/079,115

(22) Filed: Dec. 12, 2022

(65) Prior Publication Data

US 2023/0189566 A1 Jun. 15, 2023

(30) Foreign Application Priority Data

Dec. 13, 2021 (KR) ........................ 10-2021-0177412

(51) Int. Cl.
*H10K 59/121* (2023.01)
*H10D 30/67* (2025.01)
(Continued)

(52) U.S. Cl.
CPC ..... *H10K 59/1213* (2023.02); *H10D 30/6755* (2025.01); *H10K 59/1201* (2023.02); *H10K 71/00* (2023.02)

(58) Field of Classification Search
CPC ........... H10K 59/1213; H10K 59/1201; H10K 71/00; H10K 59/131; H10K 59/121;
(Continued)

(56) References Cited

U.S. PATENT DOCUMENTS 9,240,485 B2 1/2016 Liu et al.
9,614,098 B2 4/2017 Zhao et al.
(Continued)

FOREIGN PATENT DOCUMENTS

CN 103730346 B 8/2016
JP 5609989 B2 10/2014
(Continued)

OTHER PUBLICATIONS

Rongsheng Chen et al., "Self-aligned top-gate InGaZnO thin film transistors using SiO2/Al2O3 stack gate dielectric" Thin Solid Films, Sep. 17, 2013, pp. 572-575.

*Primary Examiner* — Norman D Richards
*Assistant Examiner* — Laura M Dykes
(74) *Attorney, Agent, or Firm* — Harness, Dickey & Pierce, P.L.C.

(57) ABSTRACT
A display device includes insulating layers, a light-emitting element, and a pixel circuit electrically connected to the light-emitting element. The pixel circuit includes a first transistor. The first transistor includes a metal oxide semiconductor pattern including a source region, a drain region and a channel region disposed between the source region and the drain region, a first gate disposed on the metal oxide semiconductor pattern and overlapping the channel region in a plan view, and a metal oxide pattern disposed on the first gate.

19 Claims, 17 Drawing Sheets

(51) Int. Cl.
  _H10K 59/12_  (2023.01)
  _H10K 71/00_  (2023.01)

(58) Field of Classification Search
  CPC ............. H10D 30/6755; H10D 86/423; H10D
        86/481; H10D 86/60; H10D 86/021;
                        H10D 86/451
  USPC .......................................................... 257/40
  See application file for complete search history.

(56)                References Cited

U.S. PATENT DOCUMENTS

| | | | |
|---|---|---|---|
| 10,263,060 | B2 | 4/2019 | Noh et al. |
| 10,692,994 | B2 | 6/2020 | Hosaka et al. |
| 11,152,512 | B2 | 10/2021 | Yamazaki et al. |
| 11,387,302 | B2 | 7/2022 | Han et al. |
| 2011/0168985 | A1* | 7/2011 | Kwon .................. H10K 59/122 |
| | | | 438/34 |
| 2016/0254334 | A1* | 9/2016 | Yang .................. H10D 30/6755 |
| | | | 257/40 |
| 2017/0236844 | A1* | 8/2017 | Yamazaki ............ H10D 86/423 |
| | | | 257/43 |

| | | | |
|---|---|---|---|
| 2018/0069190 | A1* | 3/2018 | Kim ..................... G09G 3/3233 |
| 2019/0081077 | A1 | 3/2019 | Suzuki et al. |
| 2019/0288048 | A1 | 9/2019 | Kang et al. |
| 2020/0066765 | A1 | 2/2020 | Cho et al. |
| 2020/0350383 | A1* | 11/2020 | Bang .................. H10K 59/1213 |
| 2021/0104558 | A1 | 4/2021 | Kim et al. |
| 2021/0111197 | A1 | 4/2021 | Moon et al. |
| 2021/0242249 | A1 | 8/2021 | Baek et al. |
| 2021/0280613 | A1* | 9/2021 | Kwon .................. H10K 59/124 |
| 2023/0081823 | A1* | 3/2023 | Noh .................... H10K 59/1216 |
| | | | 257/211 |
| 2024/0013727 | A1* | 1/2024 | Zhang .................. G09G 3/3266 |
| 2024/0072063 | A1* | 2/2024 | Hong ................. H10D 86/0221 |
| 2024/0178232 | A1* | 5/2024 | Takechi ............... H10D 86/411 |

FOREIGN PATENT DOCUMENTS

| | | |
|---|---|---|
| JP | 2019-24105 | 2/2019 |
| KR | 10-2018-0012442 | 2/2018 |
| KR | 10-2020-0004344 | 1/2020 |
| KR | 10-2020-0023573 | 3/2020 |
| KR | 10-2021-0028318 | 3/2021 |
| KR | 10-2021-0043771 | 4/2021 |

\* cited by examiner

FIG. 4

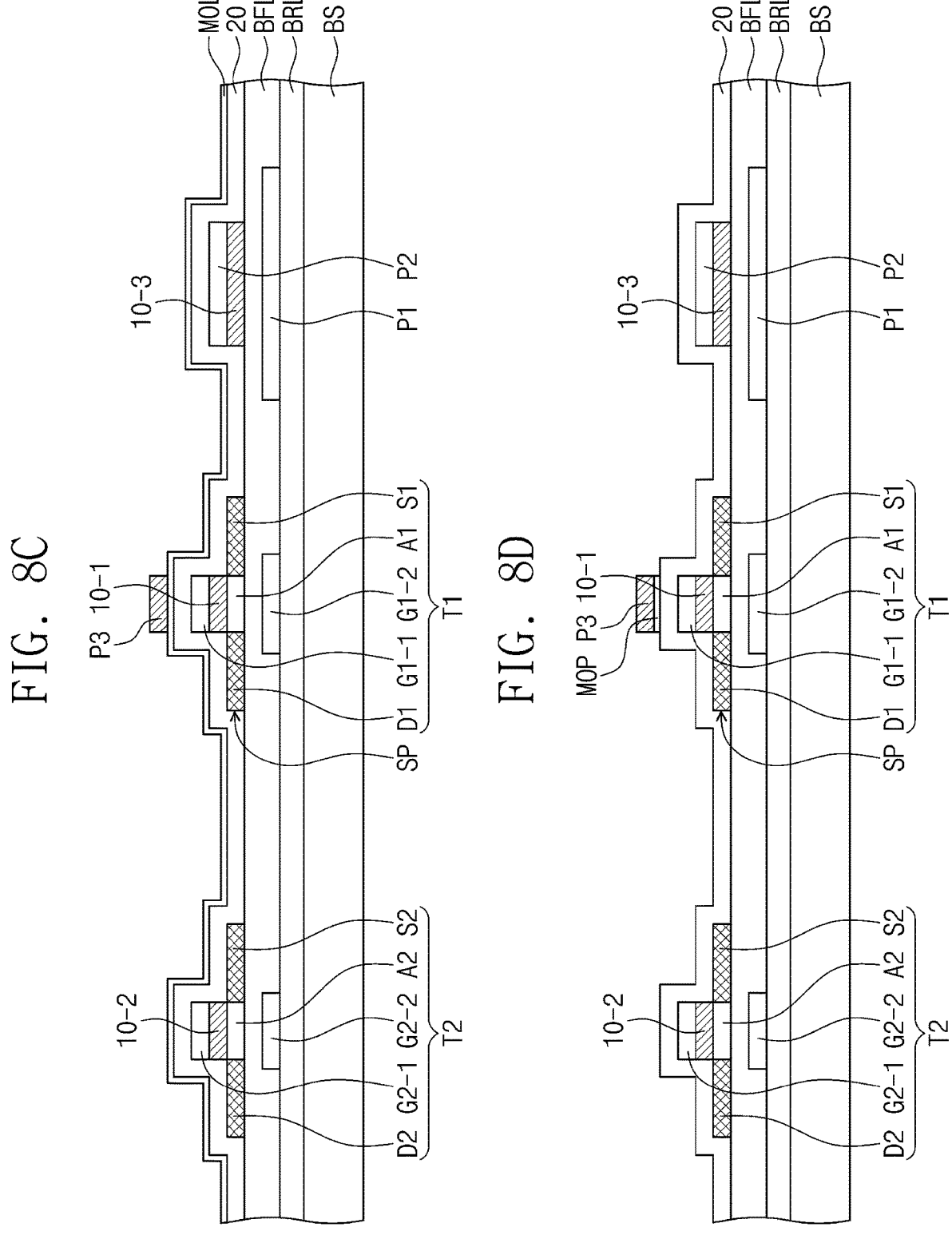

DISPLAY DEVICE COMPRISING A METAL OXIDE PATTERN AND METHOD FOR MANUFACTURING THE SAME

CROSS-REFERENCE TO RELATED APPLICATION(S)

This application claims priority to and benefits of Korean Patent Application No. 10-2021-0177412 under 35 U.S.C. § 119, filed on Dec. 13, 2021 in the Korean Intellectual Property Office, the entire contents of which are incorporated herein by reference.

BACKGROUND

1. Technical Field

The disclosure herein relates to a display device and a method for manufacturing the same, and, to a display device having an oxide transistor and a method for manufacturing the same.

2. Description of the Related Art

A display device may include pixels and a driving circuit (for example, a scan driving circuit and a data driving circuit) which controls the pixels. The pixels may each include a display element and a pixel circuit which controls the display element. The pixel circuit may include transistors organically connected to each other.

The transistors may each include a silicon semiconductor, or a metal oxide semiconductor.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device including an oxide transistor having a wide driving voltage range.

The disclosure also provides a method for manufacturing the display device.

A display device may include insulating layers; a light-emitting element; and a pixel circuit electrically connected to the light-emitting element, wherein the pixel circuit may include a first transistor, and the first transistor may include a metal oxide semiconductor pattern including a source region, a drain region and a channel region disposed between the source region and the drain region, a first gate disposed on the metal oxide semiconductor pattern, and overlapping the channel region in a plan view, and a metal oxide pattern disposed on the first gate.

In an embodiment, the insulating layers may include a first insulating layer disposed between the channel region and the first gate; a second insulating layer having a first portion disposed between the first gate and the metal oxide pattern; a second portion disposed on the source region, and a third portion disposed on the drain region; and a third insulating layer disposed on the second insulating layer and the metal oxide pattern.

In an embodiment, the first insulating layer may include a silicon oxide layer, the second insulating layer may include a silicon oxide layer or a silicon oxynitride layer, and the third insulating layer may include a silicon oxynitride layer and a silicon nitride layer disposed on the silicon oxynitride layer.

In an embodiment, the second insulating layer may cover a side surface of the first insulating layer.

In an embodiment, the metal oxide pattern may electrically contact an upper surface of the first gate.

In an embodiment, the pixel circuit may further include a conductive pattern disposed on the metal oxide pattern.

In an embodiment, a corresponding insulating layer among the insulating layers may be disposed between the first gate and the conductive pattern, and the first gate and the conductive pattern may define a capacitor.

In an embodiment, the first transistor may control a driving current of the light-emitting element based on a charged capacitance of the capacitor.

In an embodiment, the pixel circuit may further include a second transistor, the second transistor may include a metal oxide semiconductor pattern, and the second transistor may supply a data voltage to the capacitor.

In an embodiment, an edge of the metal oxide pattern may be aligned with an edge of the conductive pattern.

In an embodiment, the channel region may have a length of about 3 μm or less.

In an embodiment, the first transistor may further include a second gate electrically connected to the first gate and disposed below the metal oxide semiconductor pattern.

In an embodiment, the metal oxide pattern may include at least one of indium (In), tin (Sn), zinc (Zn), gallium (Ga), magnesium (Mg), hafnium (Hf), and titanium (Ti).

In an embodiment, the metal oxide pattern may have a thickness in a range of about 100 Å to about 300 Å.

A method for manufacturing a display device may include forming, on a base layer, a transistor including a metal oxide semiconductor pattern including a source region, a drain region, and a channel region disposed between the source region and the drain region, a first insulating layer disposed on the channel region, and a gate disposed on the first insulating layer; forming a second insulating layer that covers the gate, the source region, and the drain region; forming a metal oxide layer on the second insulating layer; etching at least a portion of the metal oxide layer; and forming a third insulating layer on the second insulating layer.

In an embodiment, the method may further include forming a conductive pattern overlapping the gate in a plan view on the metal oxide layer.

In an embodiment, in the etching of at least a portion of the metal oxide layer, the conductive pattern may be used as a mask, and a metal oxide pattern overlapping the conductive pattern in a plan view may be formed from the metal oxide layer.

In an embodiment, an edge of the metal oxide pattern may be aligned with an edge of the conductive pattern.

In an embodiment, in the forming of a metal oxide layer, an oxygen gas may have a partial pressure in a range of about 50% to about 100% with respect to a reaction gas A method for manufacturing a display device may include forming, on a base layer, a transistor including a metal oxide semiconductor pattern including a source region, a drain region, and a channel region disposed between the source region and the drain region, a first insulating layer disposed on the base layer and that covers the metal oxide semiconductor pattern, and a gate disposed on the first insulating layer; forming a metal oxide layer that covers the gate on the first insulating layer; etching at least a portion of the metal oxide layer; and forming a second insulating layer on the base layer.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings:

FIG. 4 is a schematic cross-sectional view of a display panel according to an embodiment;

FIGS. 8A to 8F are schematic cross-sectional views illustrating manufacturing processes of a display panel according to an embodiment;

DETAILED DESCRIPTION OF THE EMBODIMENTS

Figure 1:
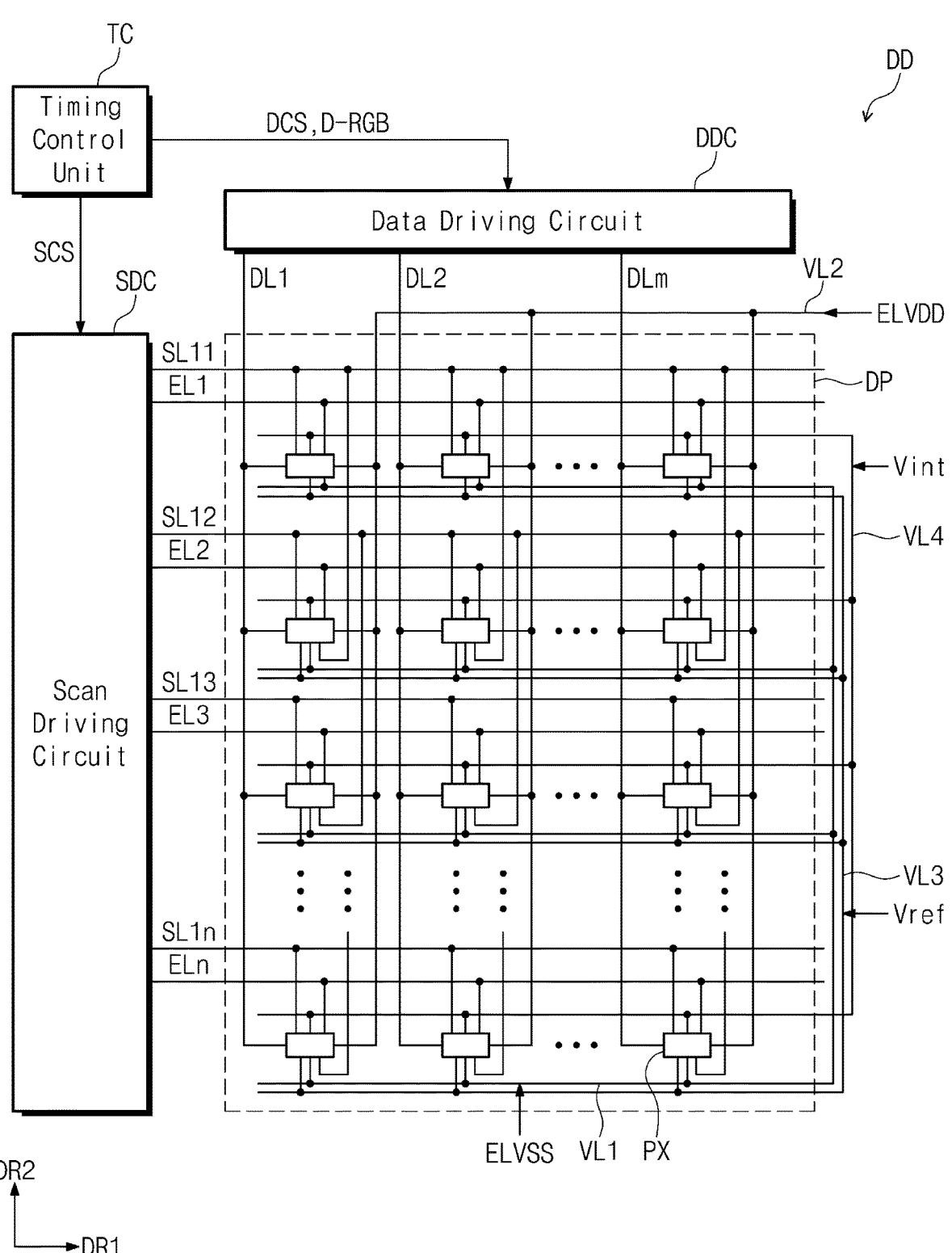
FIG. 1 is a block diagram of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, when a component (or region, layer, portion, etc.) is referred to as "on", "connected", or "coupled" to another component, it means that it is placed/connected/coupled directly on the other component or a third component or other components can be disposed between them.

It will be understood that the terms "connected to" or "coupled to" may include a physical or electrical connection or coupling.

The same reference numerals or symbols refer to the same elements. In the drawings, thicknesses, ratios, and dimensions of components may be exaggerated for effective description of technical content.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms such as first and second may be used to describe various components, but the components should not be limited by the terms. These terms are only used for the purpose of distinguishing one component from other components. For example, without departing from the scope of the disclosure, a first component may be referred to as a second component, and similarly, a second component may be referred to as a first component.

Singular expressions include plural expressions unless the context clearly indicates otherwise. As used herein, the singular forms, "a," "an," and "the" are intended to include the plural forms as well, unless the context clearly indicates otherwise.

Terms such as "below", "lower", "above", and "upper" are used to describe the relationship between components shown in the drawings. The terms are relative concepts and are described based on the directions indicated in the drawings but are not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used in this specification have the same meaning as commonly understood by one of ordinary skill in the art to which this disclosure belongs. Terms defined in commonly used dictionaries should be interpreted as having a meaning consistent with the meaning in the context of the related technology, and should not be interpreted as too ideal or too formal unless explicitly defined here.

Hereinafter, embodiments will be described with reference to the drawings.

FIG. 1 is a block diagram of a display device DD according to an embodiment. The display device DD may include a timing control unit TC, a scan driving circuit SDC, a data driving circuit DDC, and a display panel DP. In an embodiment, the display panel DP is described as a light-emitting display panel. The light-emitting display panel may include an organic light-emitting display panel or an inorganic light-emitting display panel.

The timing control unit TC receives input video signals, and converts a data format of the input video signals to meet the specification of an interface with the scan driving circuit SDC to generate video data D-RGB. The timing control unit TC outputs the video data D-RGB and various control signals DCS and SCS.

The scan driving circuit SDC receives the scan control signal SCS from the timing control unit TC. The scan control signal SCS may include a vertical initiation signal for initiating an operation of the scan driving circuit SDC, and a clock signal for determining output timings of signals, etc., within the spirit and the scope of the disclosure. The scan driving circuit SDC generates scan signals, and sequentially outputs the scan signals to corresponding scan signal lines SL11 to SL1$n$. The scan driving circuit SDC generates light-emitting control signals in response to the scan control signal SCS, and outputs the light-emitting control signals to corresponding light-emitting signal lines EL1 to ELn.

FIG. 1 illustrates that the scan signals and the light-emitting control signals are output from one scan driving circuit SDC, but the disclosure is not limited thereto. In an embodiment, the display device DD may include scan driving circuits. In an embodiment, a driving circuit, which generates and outputs the scan signals, and a driving circuit, which generates and outputs the light-emitting control signals, may be separately formed.

The data driving circuit DDC receives, from the timing control unit TC, the data control signal DCS and the video data D-RGB. The data driving circuit DDC converts the video data D-RGB to data signals, and outputs the data signals to data lines DL1 to DLm to be described later. The data signals are analog voltages corresponding to gradation values of the video data D-RGB.

The light-emitting display panel DP may include groups of scan lines. FIG. 1 illustrates, as an example, a first group of scan signal lines SL11 to SL1$n$. The light-emitting display panel DP may include light-emitting signal lines EL1 to ELn, data lines DL1 to DLm, a first voltage line VL1, a second voltage line VL2, a third voltage line VL3, a fourth voltage line VL4, and pixels PX.

The first group of scan signal lines SL11 to SL1$n$ may extend in a first direction DR1, and may be arranged (or disposed) in a second direction DR2. The data lines DL1 to DLm may intersect the first group of scan signal lines SL11 to SL1$n$.

The first voltage line VL1 receives a first power supply voltage ELVSS. The second voltage line VL2 receives a second power supply voltage ELVDD. The second power supply voltage ELVDD has a higher level than the first power supply voltage ELVSS. The third voltage line VL3 receives a reference voltage Vref (hereinafter, a first voltage). The fourth voltage line VL4 receives an initialization voltage Vint (hereinafter, a second voltage). The first voltage Vref has a lower level than the second power supply voltage ELVDD. The second voltage Vint has a lower level than the second power supply voltage ELVDD. In an embodiment, the second voltage Vint may have a lower level than the first voltage Vref and the first power supply voltage ELVSS.

At least one of the first voltage line VL1, the second voltage line VL2, the third voltage line VL3, or the fourth voltage line VL4 may include at least one of a line extending in the first direction DR1 or a line extending in the second direction DR2. Among the voltage lines, the line extending in the first direction DR1 and the line extending in the second direction DR2 may be electrically connected to each other, although disposed on different layers of insulating layers 10 to 40 illustrated in FIG. 4.

In the above, the display device DD according to an embodiment is described with reference to FIG. 1, but the display device DD according to the disclosure is not limited thereto. Signal lines may be added or omitted depending on the configuration of a pixel circuit. Electrical connection relationship between one pixel PX and signal lines may be changed.

Pixels PX may include groups that generate colors different from each other. For example, the pixels PX may include red pixels that generate a red color, green pixels that generate a green color, and blue pixels that generate a blue color. A light-emitting element of a red pixel, a light-emitting element of a green pixel, and a light-emitting element of a blue pixel may include light-emitting layers of materials different from each other.

The pixel circuit may include transistors and at least one capacitor. At least one of the scan driving circuit SDC or the data driving circuit DDC may include transistors formed through a same process as a process for manufacturing the pixel circuit.

Figure 2:
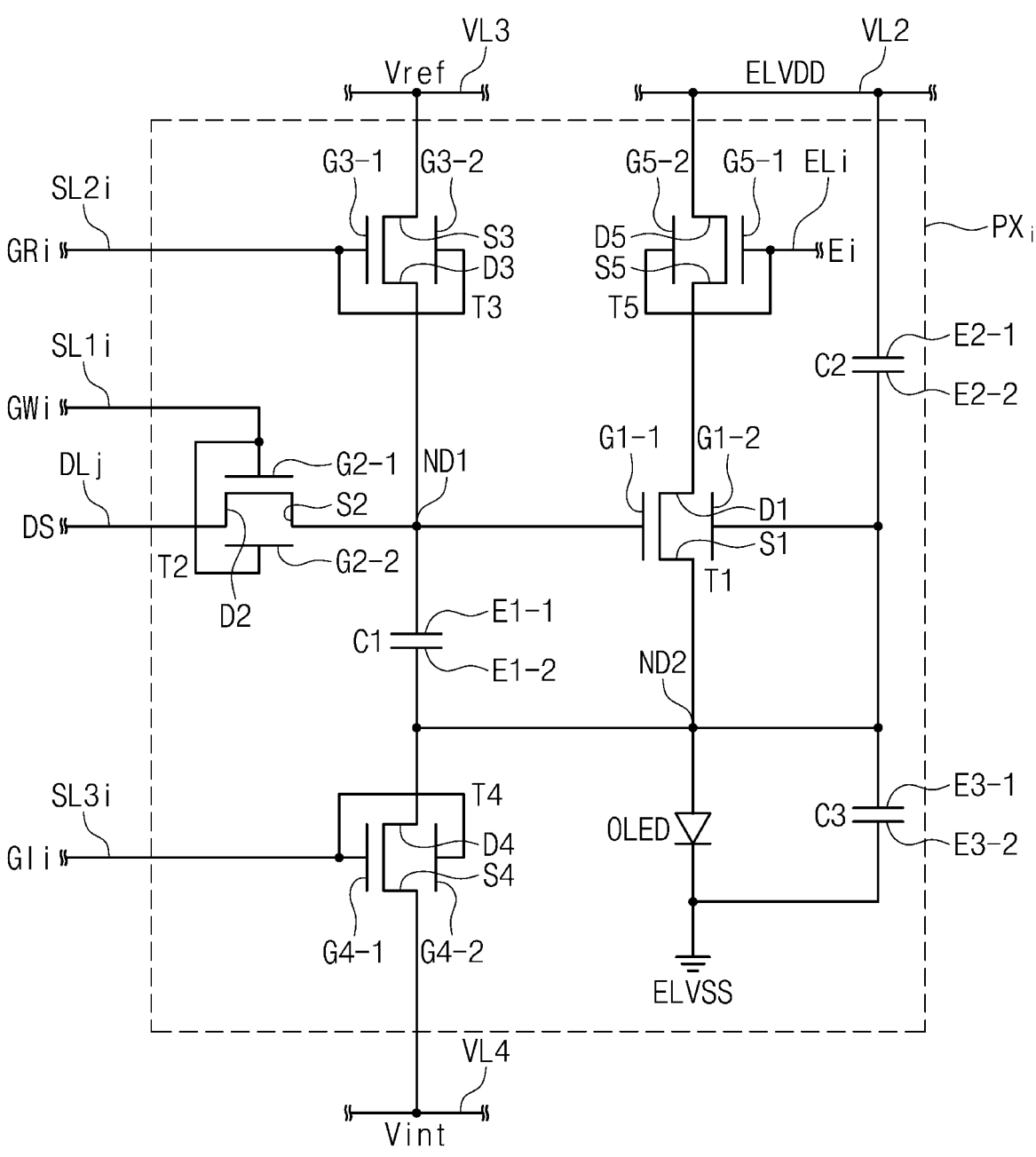
FIG. 2 is a schematic diagram of an equivalent circuit of a pixel according to an embodiment.
Figure 3:
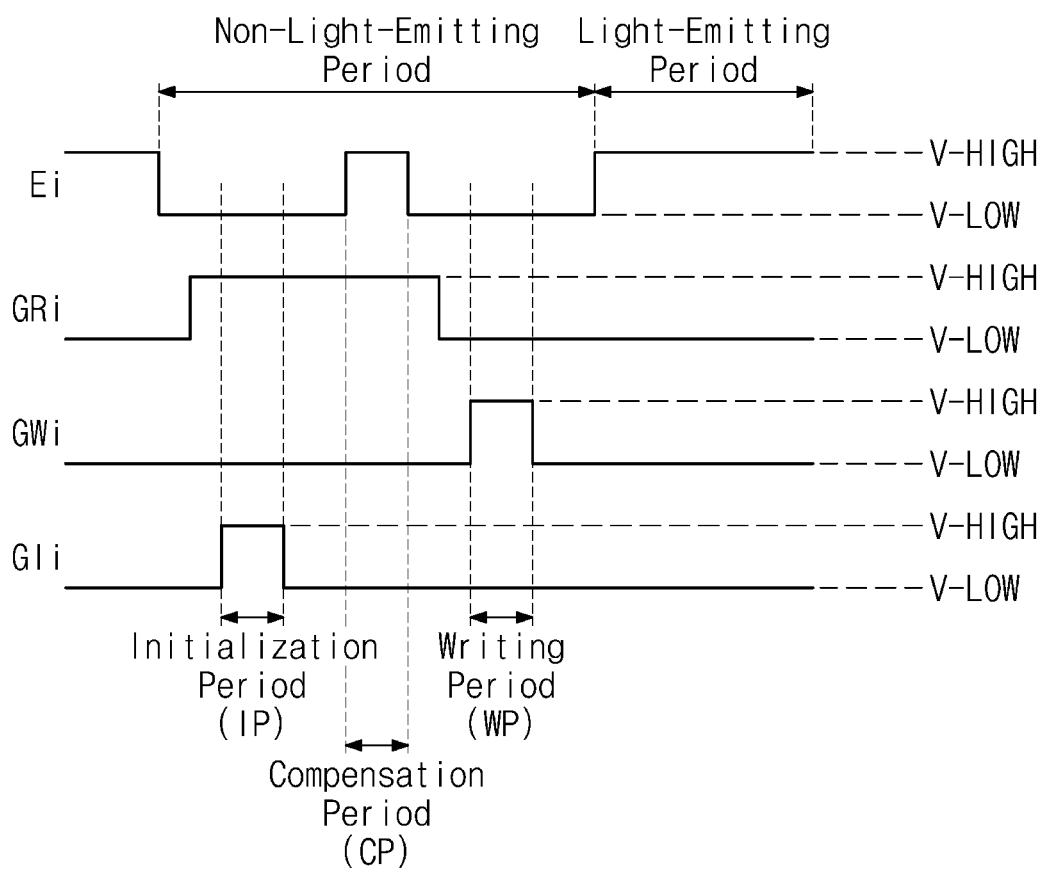
FIG. 3 is a waveform diagram of driving signals for driving a pixel illustrated in FIG. 2.

FIG. 2 is a schematic diagram of an equivalent circuit of a pixel PXij according to an embodiment. FIG. 3 is a waveform diagram of driving signals for driving the pixel PXij illustrated in FIG. 2.

FIG. 2 representatively illustrates the pixel PXij connected to an i-th scan line SL1$i$ in a first group of scan lines SL11 to SL1$n$ (see FIG. 1), and connected to a j-th data line DLj in data lines DL1 to DLm (see FIG. 1). The pixel PXij is connected to an i-th scan line SL2$i$ in a second group of scan lines, and is connected to an i-th scan line SL3$i$ in a third group.

In an embodiment, a pixel circuit may include first to fifth transistors T1 to T5, first to third capacitors C1 to C3, and a light-emitting element OLED. In an embodiment, the first to fifth transistors T1 to T5 will be described as N-type transistors. However, an embodiment is not limited thereto, and at least one of the first to fifth transistors T1 to T5 may be a P-type transistor. In an embodiment, at least one of the first to fifth transistors T1 to T5 may be omitted, or an additional transistor may be further included in the pixel PXij.

In an embodiment, it is illustrated that the first to fifth transistors T1 to T5 each include two gates, but at least one transistor may include only one gate. It is illustrated that upper gates G2-1, G3-1, G4-1, and G5-1 and lower gates G2-2, G3-2, G4-2, and G5-2 of each of second to fifth transistors T2 to T5 are electrically connected to each other, but an embodiment is not limited thereto. The lower gates G2-2, G3-2, G4-2, and G5-2 of each of the second to fifth transistors T2 to T5 may be floating electrodes.

In an embodiment, a first transistor T1 may be a driving transistor, and a second transistor T2 may be a switching transistor. A node to which a gate G1-1 (hereinafter, a first upper gate) of the first transistor T1 is connected may be defined as a first node ND1, and a node to which a first source S1 of the first transistor T1 is connected may be defined as a second node ND2.

The light-emitting element OLED may include a first electrode electrically connected to the first node ND1, a second electrode that receives a first power supply voltage ELVSS, and a light-emitting layer disposed between the first electrode and the second electrode. Detailed description of the light-emitting element OLED will be made later.

The first transistor T1 is electrically connected between the second node ND2 and the second voltage line VL2 through which the second power supply voltage ELVDD is received. The first transistor T1 may include a source S1 (hereinafter, a first source) connected to the second node ND2, a drain D1 (hereinafter, a first drain), a channel region (or semiconductor region), and the first upper gate G1-1. The first transistor T1 may further include a gate G1-2 (hereinafter, a first lower gate) connected to the second node ND2. The first transistor T1 controls a driving current of the light-emitting element OLED on the basis of a charged capacitance of the first capacitor C1.

The second transistor T2 is electrically connected between the first data line DLj and the first node ND1. The second transistor T2 may include a source S2 (hereinafter, a second source) connected to the first node ND1, a drain D2 (hereinafter, a second drain) connected to the first data line DLj, a channel region, and a gate G2-1 (hereinafter, a second upper gate) connected to the i-th scan line SL1$i$ in the first group. The second transistor T2 may further include a gate G2-2 (hereinafter, a second lower gate) electrically connected to the second upper gate G2-1. Third to fifth transistors T3 to T5 to be described later may include upper gates G3-1, G4-1, and G5-1 and lower gates G3-2, G4-2, and G5-2 respectively corresponding to the second upper gate G2-1 and the second lower gate G2-2. The second transistor T2 provides the first capacitor C1 with a data voltage.

The third transistor T3 is electrically connected between the first node ND1 and the third voltage line VL3 through which the first voltage Vref is received. The third transistor T3 may include a drain D3 (hereinafter, a third drain) connected to the first node ND1, a source S3 (hereinafter, a third source) connected to the third voltage line VL3, a channel region, and a third upper gate G3-1 connected to the i-th scan line SL2$i$ in the second group.

The fourth transistor T4 is electrically connected between the second node ND2 and the fourth voltage line VL4 through which the second voltage Vint is received. The fourth transistor T4 may include a drain D4 (hereinafter, a fourth drain) connected to the second node ND2, a source S4 (hereinafter, a fourth source) connected to the fourth voltage line VL4, a channel region, and a fourth upper gate G4-1 connected to the i-th scan line SL3$i$ in the third group.

The fifth transistor T5 is electrically connected between the second voltage line VL2 and the first drain D1 or the first source S1. In an embodiment, the fifth transistor T5 may include a drain D5 (hereinafter, a fifth drain) connected to the first drain D1, a source S5 (hereinafter, a fifth source) connected to the second voltage line VL2, a channel region, and a fifth upper gate G5-1 connected to the i-th light-emitting signal line ELi.

The first capacitor C1 is electrically connected between the first node ND1 and the second node ND2. The first capacitor C1 may include a first electrode E1-1 connected to the first node ND1 and a second electrode E1-2 connected to the second node ND2.

The second capacitor C2 is electrically connected between the second voltage line VL2 and the second node ND2. The second capacitor C2 may include a first electrode E2-1 connected to the second voltage line VL2 and a second electrode E2-2 connected to the second node ND2.

The third capacitor C3 is electrically connected between a first electrode and a second electrode of the light-emitting element OLED. The third capacitor C3 may include a first electrode E3-1 connected to the first electrode of the light-emitting element OLED and a second electrode E3-2 connected to the second electrode of the light-emitting element OLED.

An operation of the pixel PXij will be described in more detail with reference to FIGS. 2 and 3. The display device DD (see FIG. 1) displays a video in every frame period. Respective signal lines of a first group of scan lines, a second group of scan lines, a third group of scan lines, and light-emitting signal lines are sequentially scanned during a frame period. FIG. 3 illustrates a part of the frame period.

Referring to FIG. 3, signals Ei, GRi, GWi, and GIi may each have a high level V-HIGH during a partial period, and have a low level V-LOW during the other partial period. N-typed first to fifth transistors T1 to T5 described above are turned-on in case that control signals corresponding thereto have high levels V-HIGH.

During an initialization period IP, the third transistor T3 and the fourth transistor T4 are turned-on. The first node ND1 is initialized to the first voltage Vref. The second node ND2 is initialized to the second voltage Vint. The first capacitor C1 is initialized to a difference value between the first voltage Vref and the second voltage Vint. The second capacitor C2 is initialized to a difference value between the second power supply voltage ELVDD and the second voltage Vint. The third capacitor C3 is initialized to a difference value between the first power supply voltage ELVSS and the second voltage Vint.

During a compensation period CP, the third transistor T3 and the fifth transistor T5 are turned-on. The first capacitor C1 is compensated by a voltage corresponding to a threshold voltage of the first transistor T1.

During a writing period WP, the second transistor T2 is turned-on. The second transistor T2 outputs a voltage (or data voltage) corresponding to a data signal DS. As a result, a voltage level corresponding to the data signal DS is charged in the first capacitor C1. The data signal DS, in which the threshold voltage of the first transistor T1 is compensated, is charged in the first capacitor C1. Threshold voltages of driving transistors may be different from each other in each pixel PX (see FIG. 1), the pixel PXij illustrated in FIGS. 2 and 3 may supply, to the light-emitting element OLED, a current with a magnitude proportional to the data signal DS regardless of the deviation between the threshold voltages of the driving transistors.

Thereafter, during a light-emitting period, the fifth transistor T5 is turned-on. The first transistor T1 supplies, to the light-emitting element OLED, a current corresponding to a stored charged capacitance of the capacitor C1. The light-emitting element OLED may emit light having luminance corresponding to the data signal DS.

Figure 4:
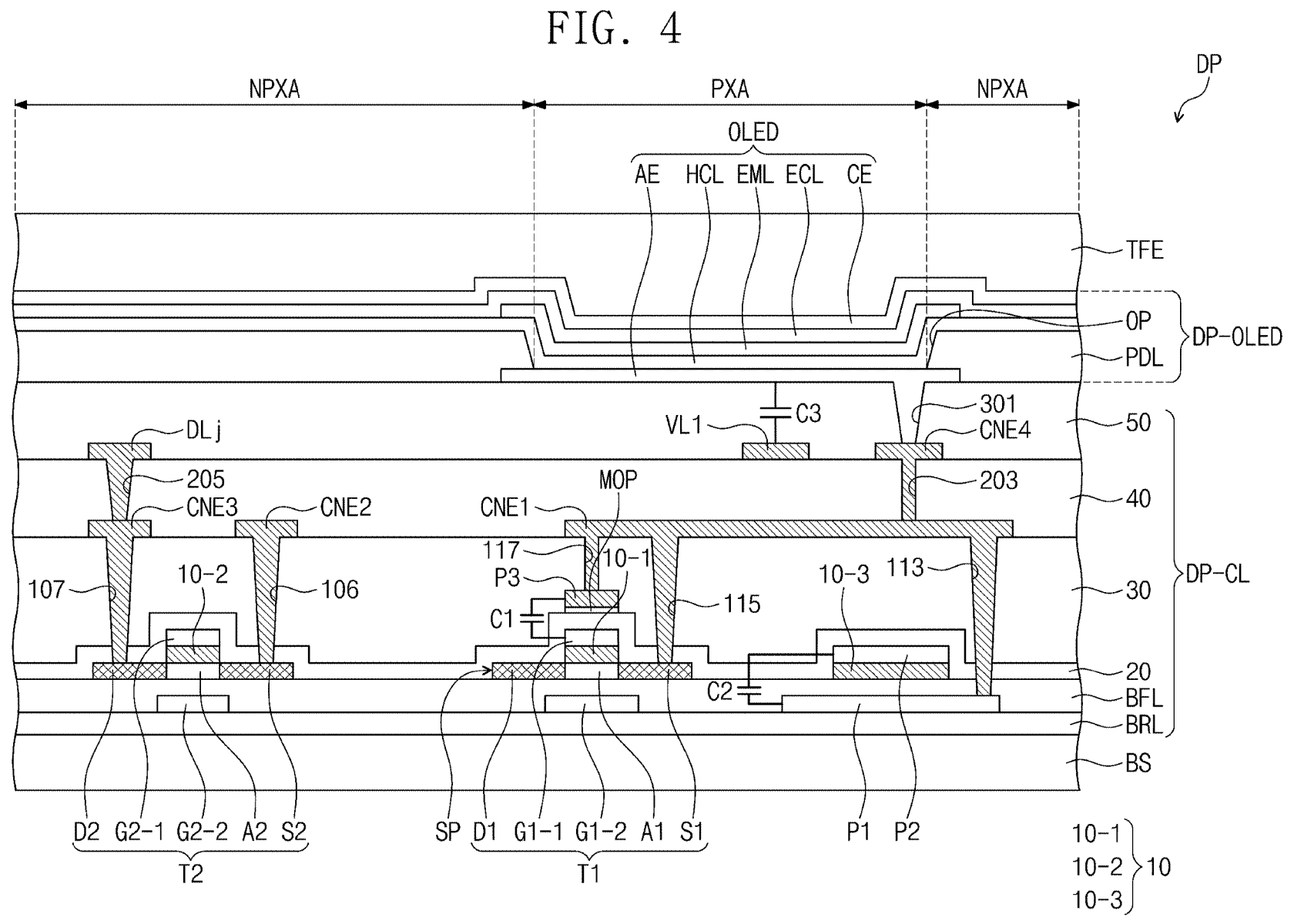

FIG. 4 is a schematic cross-sectional view of a display panel DP according to an embodiment. FIG. 4 illustrates a schematic cross-section of a part corresponding to a partial configuration in a pixel PXij illustrated in FIG. 2.

Referring to FIG. 4, the display panel DP may include a base layer BS, a circuit element layer DP-CL disposed on the base layer BS, a display element layer DP-OLED, and a thin film encapsulation layer TFE. The display panel DP may further include functional layers such as an anti-reflective layer or a refractive index control layer. The circuit element layer DP-CL may include at least insulating layers and a circuit element. Insulating layers to be described later may include an organic layer and/or an inorganic layer.

An insulating layer, a semiconductor layer, and a conductive layer are formed through a process such as coating and deposition. Thereafter, the insulating layer, the semiconductor layer, and the conductive layer may be selectively patterned through photolithography and etching processes. A semiconductor pattern, a conductive pattern, a signal line, etc., are formed through such processes. Patterns disposed on a same layer may be formed through a same process.

The base layer BS may include a synthetic resin film. A synthetic resin layer may include a thermosetting resin. By way of example, the synthetic resin layer may be a polyimide-based resin layer, and is not limited to a given or selected material. The synthetic resin layer may include at least one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, or a perylene-based resin. The base layer may include a glass substrate, a metal substrate, an organic/inorganic composite substrate, or the like within the spirit and the scope of the disclosure. The base layer may include a first polyimide layer, a second polyimide layer, and an inorganic layer disposed therebetween.

At least one inorganic layer is formed on an upper surface of the base layer BS. The inorganic layer may include at least one of aluminum oxide, titanium oxide, silicon oxide, silicon nitride, silicon oxynitride, zirconium oxide, or hafnium oxide. The inorganic layer may have a multilayer structure. Multilayered inorganic layers may constitute a barrier layer BRL and/or a buffer layer BFL to be described later. The barrier layer BRL and the buffer layer BFL may be selectively disposed.

The barrier layer BRL prevents foreign matters from being introduced from the outside. The barrier layer BRL may include a silicon oxide layer and a silicon nitride layer. The silicon oxide layer and the silicon nitride layer may be each provided in plurality, and may be alternately stacked each other.

A conductive layer (hereinafter, a first conductive layer) is disposed on the barrier layer BRL. The first conductive layer may include conductive patterns. FIG. 4 illustrates a partial pattern of the first conductive pattern. A first lower gate G1-2, a second lower gate G2-2, and a first conductive pattern P1 are illustrated as an example of the conductive patterns of the first conductive layer.

The first conductive pattern P1 defines the second electrode E2-2 of the second capacitor C2 illustrated in FIG. 2. The first lower gate G1-2 and the first conductive pattern P1 are illustrated in FIG. 4 as being spaced apart from each other, but may be electrically connected to each other. The first lower gate G1-2 and the first conductive pattern P1 may be connected to each other through a conductive pattern disposed on a layer different from a layer on which the first lower gate G1-2 and the first conductive pattern P1 are disposed. By way of example, the first lower gate G1-2 and the first conductive pattern P1 may have an integrated shape on a plane. It is to be understood that the shapes disclosed herein include shapes substantial to the shapes disclosed herein.

The buffer layer BFL may be disposed on the barrier layer BRL to cover the first lower gate G1-2, the second lower gate G2-2, and the first conductive pattern P1. The buffer layer BFL improves a binding force between the base layer BS and a semiconductor pattern and/or a conductive pattern. The buffer layer BFL may include a silicon oxide layer and a silicon nitride layer. The silicon oxide layer and the silicon nitride layer may be alternately stacked each other.

A semiconductor layer is disposed on the buffer layer BFL. The semiconductor layer may include semiconductor patterns. In an embodiment, the semiconductor pattern may be a metal oxide semiconductor pattern SP. The metal oxide semiconductor pattern SP may include a crystalline or amorphous oxide semiconductor. For example, the metal oxide semiconductor pattern SP may include: an oxide of metal such as zinc (Zn), indium (In), gallium (Ga), tin (Sn), titanium (Ti); or a mixture of metal such as zinc (Zn), indium (In), gallium (Ga), tin (Sn), titanium (Ti), and an oxide thereof. An oxide semiconductor may include indium-tin oxide (ITO), indium-gallium-zinc oxide (IGZO), zinc oxide (ZnO), indium-zinc oxide (IZnO), zinc-gallium oxide (ZIO), indium oxide (InO), titanium oxide (TiO), indium-zinc-tin oxide (IZTO), zinc-tin oxide (ZTO), or the like within the spirit and the scope of the disclosure.

The metal oxide semiconductor pattern SP may include regions divided depending on whether or not the metal oxide is reduced. A region (hereinafter, a reduced region) in which the metal oxide is reduced has a greater conductivity than a region (hereinafter, a non-reduced region) in which the metal oxide is not reduced. The reduced region substantially serves as a source region, a drain region of a transistor, or a signal delivery region. The non-reduced region substantially corresponds to a channel region (or semiconductor region, or non-reduced region) of a transistor. In other words, one part of a semiconductor pattern may be a channel region of a transistor, another part may be a source region or a drain region of the transistor, and still another part may be a signal delivery region.

Substantially, a first upper gate G1-1 to be described later defines a channel region A1 of the first transistor T1, and a second upper gate G2-1 to be described later defines a channel region A2 of the second transistor T2. The length of the channel region A1 of the first transistor T1 may be determined to correspond to the width of the first upper gate G1-1, and the length of the channel region A2 of the second transistor T2 may be determined to correspond to the width of the second upper gate G2-1.

A source region or a drain region itself may be a source or a drain of each of transistors T1 to T5 described in FIG. 2. The source or the drain of each of the transistors T1 to T5 may include the source region or the drain region of the semiconductor pattern described above and a conductive pattern connected thereto. Hereinafter, the source region or drain region of the metal oxide semiconductor pattern SP is referred to as a source or drain for convenience of explanation.

As illustrated in FIG. 4, the first transistor T1 may include the metal oxide semiconductor pattern SP including a source S1, a channel region A1, and a drain D1. The source S1 and the drain D1 of the first transistor T1 extends from the channel region A1 in directions opposite to each other. A source S2, a channel region A2, and a drain D2 of the second transistor T2 are also formed from a semiconductor pattern.

The first lower gate G1-2 and the second lower gate G2-2 described above serve as a light-blocking pattern. The first lower gate G1-2 and the second lower gate G2-2 are respectively disposed under or below the channel region A1 of the first transistor T1 and the channel region A2 of the second transistor T2 to block light incident from the outside. The first lower gate G1-2 and the second lower gate G2-2 prevent external light from changing the voltage-current characteristics of each of the first transistor T1 and the second transistor T2.

A first insulating layer 10 is disposed on the buffer layer BFL. In an embodiment, the first insulating layer 10 is not entirely formed on the display panel DP, and overlaps only on a channel region of a transistor, or a given or selected conductive pattern to be described later. The first insulating layer 10 may include insulating patterns. FIG. 4 illustrates, as an example, a first insulating pattern 10-1, a second insulating pattern 10-2, and a third insulating pattern 10-3. In an embodiment, the first insulating layer 10 may not be patterned. The first insulating layer 10 may cover the metal oxide semiconductor pattern SP.

The first insulating pattern 10-1 and the second insulating pattern 10-2 respectively overlap the first upper gate G1-1 and the second upper gate G2-1 to be described later. The third insulating pattern 10-3 overlaps a second conductive pattern P2 to be described later.

A conductive layer (hereinafter, a second conductive layer) is disposed on the first insulating layer 10. The second conductive layer may include conductive patterns each overlapping the first insulating layer 10. FIG. 4 illustrates the first upper gate G1-1, the second upper gate G2-1, and the second conductive pattern P2 as an example of conductive patterns of the second conductive layer. Since the second conductive layer and the first insulating layer 10 are etched through a same process, the conductive patterns of the second conductive layer and the insulating patterns of the first insulating layer 10 may substantially have a same shape. An edge of the conductive pattern of the second conductive layer and an edge of the insulating pattern of the first insulating layer 10 overlapping each other are aligned. The first upper gate G1-1 may define the first electrode E1-1 of the first capacitor C1 illustrated in FIG. 2. The first upper gate G1-1 may extend from the first electrode E1-1 of the first capacitor C1 on a plane, and thus the first upper gate G1-1 may be defined as a part of the first electrode E1-1 of the first capacitor C1.

The second conductive pattern P2 defines the first electrode E2-1 of the second capacitor C2 illustrated in FIG. 2. Although not illustrated, the second conductive pattern P2 may be electrically connected to the second voltage line VL2.

A second insulating layer 20, which covers the first upper gate G1-1, the second upper gate G2-1, and the second conductive pattern P2, is disposed on the buffer layer BFL. The second insulating layer 20 may be an inorganic layer and/or an organic layer, and may have a single- or multi-layered structure. The second insulating layer 20 may cover the source S1 and the drain D1 of the first transistor T1, and the source S2 and the drain D2 of the second transistor T2. The second insulating layer 20 may cover side surfaces of each of the first insulating pattern 10-1, the second insulating pattern 10-2, and the third insulating pattern 10-3.

A metal oxide pattern MOP may be disposed on the second insulating layer 20. Detailed description thereof will be made later with reference to FIG. 6.

A conductive layer (hereinafter, a third conductive layer) is disposed on the second insulating layer 20. The third conductive layer may include conductive patterns overlapping the second insulating layer 20. The third conductive layer may include a third conductive pattern P3 overlapping the first upper gate G1-1. The third conductive pattern P3 defines the second electrode E1-2 of the first capacitor C1 illustrated in FIG. 2. The third conductive pattern P3 may extend from the second electrode E1-2 of the first capacitor C1 on a plane, and thus the third conductive pattern P3 may be defined as a part of the second electrode E1-2 of the first capacitor C1.

In an embodiment, although the third conductive layer may include a conductive pattern, the third conductive pattern P3 overlapping the first upper gate G1-1 may be omitted. For example, the second electrode E1-2 of the first capacitor C1 may not overlap the first upper gate G1-1.

A third insulating layer 30 covering the third conductive pattern P3 is disposed on the second insulating layer 20. In an embodiment, the third insulating layer 30 may be an inorganic layer and/or an organic layer, and may have a single- or multi-layered structure.

A conductive layer (hereinafter, a fourth conductive layer) is disposed on the third insulating layer 30. The fourth conductive layer may include conductive patterns. The fourth conductive layer may include connection electrodes. FIG. 4 illustrates first to third connection electrodes CNE1 to CNE3. The first connection electrode CNE1 may be connected to the first conductive pattern P1 through a contact hole 113 penetrating the buffer layer BFL, and the second and third insulating layers 20 and 30, may be connected to the first source S1 through a contact hole 115 penetrating the second and third insulating layers 20 and 30, and may be connected to the third conductive pattern P3 through a contact hole 117 penetrating the third insulating layer 30. The second connection electrode CNE2 is connected to the second source S2 through a contact hole 106 penetrating the second and third insulating layers 20 and 30, and the third connection electrode CNE3 is connected to the second drain D2 through a contact hole 107 penetrating the second and third insulating layers 20 and 30.

A fourth insulating layer 40 covering the fourth conductive layer is disposed on the third insulating layer 30. In an embodiment, the fourth insulating layer 40 may be an organic layer, and may have a single-layered structure, but an embodiment is not limited thereto.

A conductive layer (hereinafter, a fifth conductive layer) is disposed on the fourth insulating layer 40. The fifth conductive layer may include conductive patterns. The fifth conductive layer may include a fourth connection electrode CNE4. The fourth connection electrode CNE4 is connected to the first connection electrode CNE1 through a contact hole 203 penetrating the fourth insulating layer 40.

The fifth conductive layer may further include a data line DLj and a first voltage line VL1. The data line DLj may be connected to the third connection electrode CNE3 through a contact hole 205 penetrating the fourth insulating layer 40. A part of the first voltage line VL1 overlapping the first electrode AE of the light-emitting element OLED to be described later defines the second electrode E3-2 of the third capacitor C3 illustrated in FIG. 2. A part of the first electrode AE of the light-emitting element OLED defines the first electrode E3-1 of the third capacitor C3 illustrated in FIG. 2.

A fifth insulating layer 50, which covers the fourth conductive layer, is disposed on the fourth insulating layer 40. In an embodiment, the fifth insulating layer 50 may be an organic layer, and may have a single-layered structure, but an embodiment is not specially limited thereto.

The first electrode AE of the light-emitting element OLED is disposed on the fifth insulating layer 50. The first electrode AE may be an anode. A pixel-defining film PDL is disposed on the fifth insulating layer 50. The first electrode AE is connected to a fourth connection electrode CNE4 through a contact hole 301 penetrating the fifth insulating layer 50.

An opening OP of the pixel-defining film PDL exposes at least a part of the first electrode AE. The opening OP of the pixel-defining film PDL may define a light-emitting region PXA. For example, pixels PX (see FIG. 1) may be disposed according to a given or selected rule on a plane of the display panel DP (see FIG. 1). A region in which the pixels PX are disposed may be defined as a pixel region, and one pixel region may include a light-emitting region PXA and a non-light-emitting region NPXA adjacent to the light-emitting region PXA. The non-light-emitting region NPXA may surround the light-emitting region PXA.

A hole control layer HCL may be disposed, in common, on the light-emitting region PXA and the non-light-emitting region NPXA. A common layer such as the hole control layer HCL may be formed, in common, on the pixels PX. The hole control layer HCL may include a hole transport layer and a hole injection layer.

A light-emitting layer EML is disposed on the hole control layer HCL. The light-emitting layer EML may be disposed only in a region corresponding to the opening OP. The light-emitting layer EML may be separately formed in each of the pixels PX.

In an embodiment, a patterned light-emitting layer EML is illustrated as an example, but the light-emitting layer EML may be disposed, in common, on the pixels PX. The light-emitting layer EML disposed in common may generate white light or blue light. The light-emitting layer EML may have a multi-layered structure.

An electron control layer ECL is disposed on the light-emitting layer EML. The electron control layer ECL may include an electron transport layer and an electron injection layer. A second electrode CE is disposed on the electron control layer ECL. The electron control layer ECL and the second electrode CE are disposed, in common, on the pixels PX.

A thin film encapsulation layer TFE is disposed on the second electrode CE. The thin film encapsulation layer TFE is disposed, in common, on the pixels PX. In an embodiment, the thin film encapsulation layer TFE may cover or directly covers the second electrode CE. In an embodiment, a capping layer covering or directly covering the second electrode CE may be further disposed. In an embodiment, the stack structure of the light-emitting element OLED may have a structure in which the structure shown in FIG. 4 is upside down.

The thin film encapsulation layer TFE may include at least an inorganic layer or an organic layer. In an embodiment, the thin film encapsulation layer TFE may include two inorganic layers and an organic layer disposed therebetween. In an embodiment, the thin film encapsulation layer may include inorganic layers and organic layers which may be alternately stacked each other.

Figure 5:
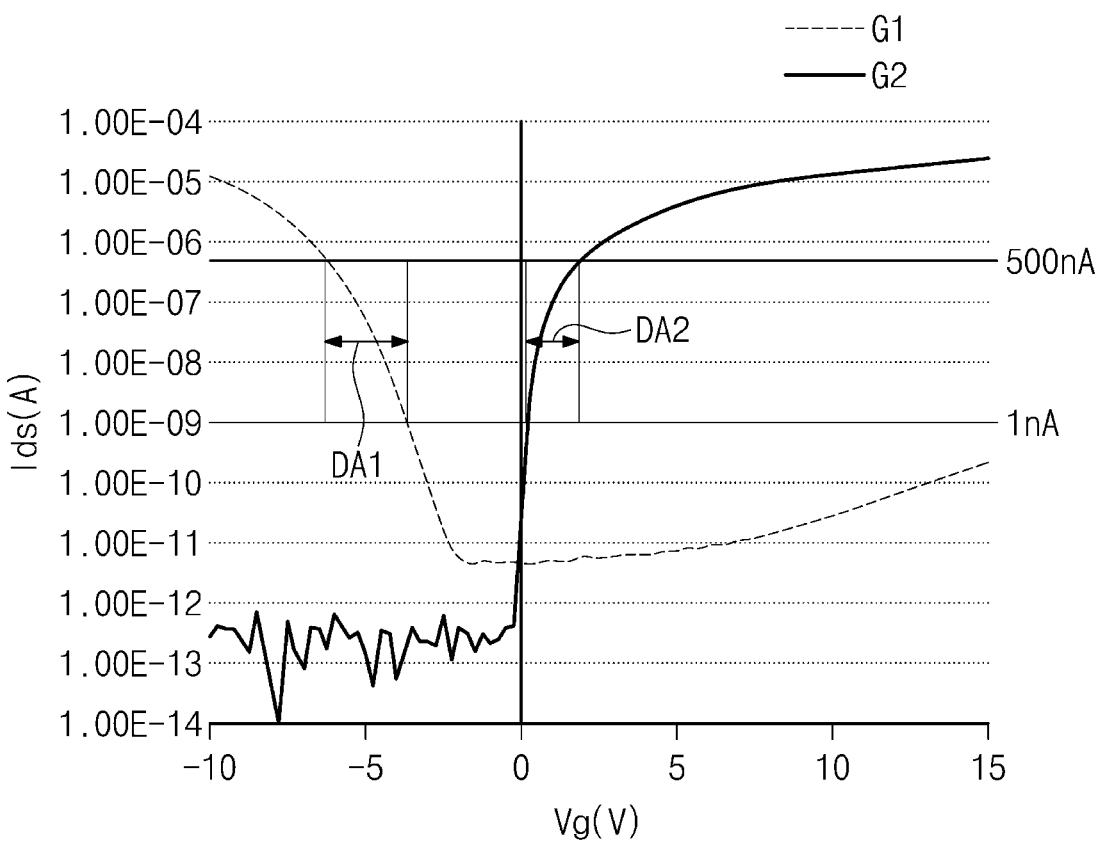
FIG. 5 is a graph comparing the voltage-current characteristics of an oxide transistor and a silicon transistor.
Figure 6:
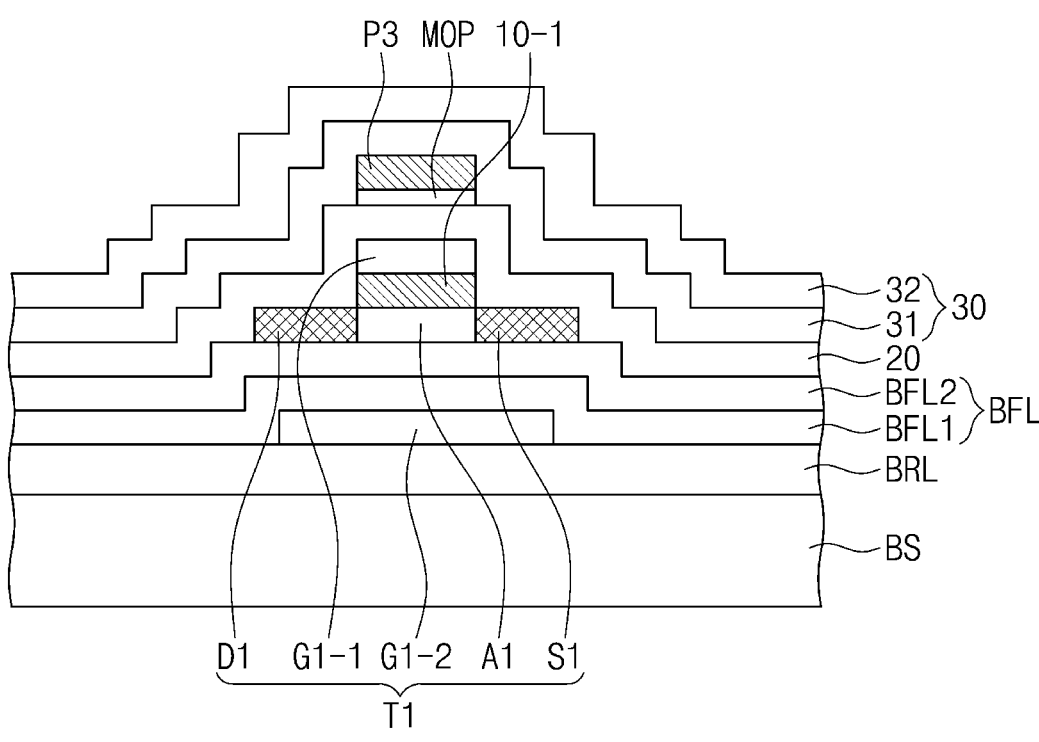
FIG. 6 is an enlarged schematic cross-sectional view of a first transistor according to an embodiment.
Figure 7:
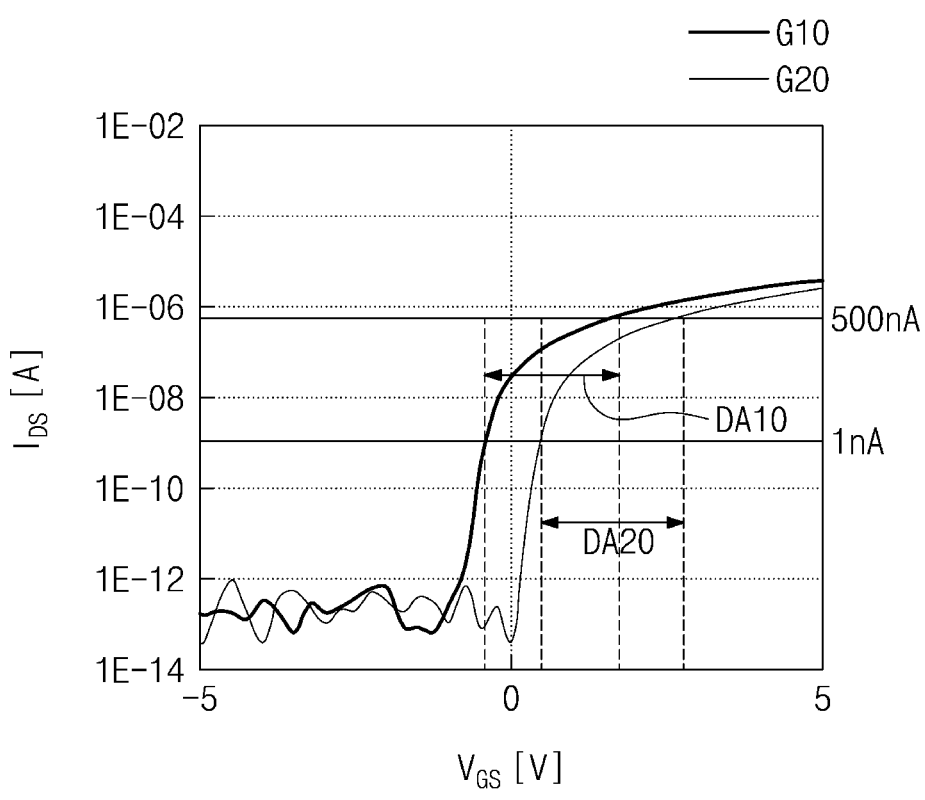
FIG. 7 is a graph comparing the voltage-current characteristics of an oxide transistor and an oxide transistor according to a comparative example.

FIG. 5 is a graph in which the voltage-current characteristics of an oxide transistor and a silicon transistor are compared. FIG. 6 is an enlarged schematic cross-sectional view of a first transistor T1 according to an embodiment. FIG. 7 is a graph in which the voltage-current characteristics of an oxide transistor and an oxide transistor are compared according to a comparative example.

A first graph G1 in FIG. 5 shows the voltage-current characteristics of a P-type silicon transistor. A second graph G2 shows the voltage-current characteristics of an N-type oxide transistor. According to the first graph G1 and the second graph G2, it may be seen that a gate voltage (Vg) range DA2 (hereinafter, a driving voltage range) of an oxide transistor having a driving current (Ids) in a range of about 1 nA to about 500 nA is narrower than a gate voltage (Vg) range DA1 of a silicon transistor having a driving current (Ids) in a range of about 1 nA to about 500 nA. In case that the driving voltage range is narrow, there may be a limitation in that a gradation voltage needs to be finely controlled to express gradations. An oxide transistor is advantageous in having a smaller leakage current than a silicon transistor.

According to what will be described later, the first transistor T1 may have a wider driving voltage range by controlling resistances of the first source S1 and the first drain D1 of the first transistor T1. Detailed description thereof will be made with reference to FIGS. 6 and 7.

Referring to FIG. 6, a buffer layer BFL may include a silicon nitride layer BFL1 and a silicon oxide layer BFL2. A first insulating pattern 10-1 may include a silicon oxide layer. A first upper gate G1-1 and a third conductive pattern P3 may have a single- or multi-layered structure consisting of any one among molybdenum (Mo), aluminum (Al), chromium (Cr), gold (Au), titanium (Ti), nickel (Ni), neodymium (Nd), and copper (Cu), or an alloy thereof.

A second insulating layer 20 may include a silicon oxide layer or a silicon oxynitride layer. A third inorganic layer 30 may include a silicon oxynitride layer 31 and a silicon nitride layer 32 disposed on the silicon oxynitride layer 31.

According to an embodiment, a metal oxide pattern MOP may be disposed between the third conductive pattern P3 and the second insulating layer 20. The metal oxide pattern MOP may have a thickness in a range of about 100 Å to about 300 Å. The metal oxide pattern MOP may include: an oxide of any one among indium (In), tin (Sn), zinc (Zn), gallium (Ga), magnesium (Mg), hafnium (Hf), and titanium (Ti); or a mixture of any one metal among indium (In), tin (Sn), zinc (Zn), gallium (Ga), magnesium (Mg), hafnium (Hf), and titanium (Ti), and an oxide thereof.

The metal oxide pattern MOP may be formed through sputtering or metal organic chemical vapor deposition (MOCVD), an oxygen gas is used in such a process, during which oxygen is supplied to the second insulating layer 20 disposed thereunder. In this sense, the metal oxide pattern MOP may be defined as an oxygen supply pattern. The oxygen supplied to the second insulating layer 20 may diffuse to the lower side of the second insulating layer 20 during a subsequent heat-treatment process, and may move to an oxide semiconductor pattern. The first upper gate G1-1 may be disposed on the channel region A1, thereby blocking oxygen from diffusing toward the channel region A1. Accordingly, the oxygen supplied to the channel region A1 may be less than the oxygen supplied to the source S1 and the drain D1.

Hydrogen may be supplied to the source S1 and the drain D1 in the process of forming the second insulating layer 20 and the third inorganic layer 30. By way of example, since the process of forming the silicon nitride layer 32 maintains high hydrogen partial pressure, a large amount of hydrogen may be supplied to the oxide semiconductor pattern.

Hydrogen corresponds to a carrier, and thus reduces the resistance of the metal oxide semiconductor pattern, especially, the resistances of the source S1 and the drain D1. The first upper gate G1-1 may be disposed on the channel region A1, thereby blocking hydrogen from diffusing toward the channel region A1. Accordingly, the channel region A1 may maintain semiconductor characteristics, compared to the first source S1 and the first drain D1.

The amount of hydrogen and oxygen supplied to the source S1 and the drain D1 in the aforementioned process may determine the resistances of the source S1 and the drain D1. Oxygen supplied to the source S1 and the drain D1 may reduce oxygen deficiency in the source S1 and the drain D1, and may suppress oxygen deficiency and hydrogen bonding, thereby preventing reduction in the resistances of the source S1 and the drain D1.

In the process of forming the metal oxide pattern MOP, although the first upper gate G1-1 covers the channel region A1, oxygen may diffuse to an edge region of the channel region A1 in boundary regions between the channel region A1 and the source S1 or between the channel region A1 and the drain D1. In the aforementioned process of forming the silicon nitride layer 32 of the third insulating layer 30, although hydrogen diffuses to the edge region of the channel region A1 in the boundary region between the channel region A1 and the source S1 or between the channel region A1 and the drain D1, oxygen deficiency may be removed by oxygen that has been already supplied. Therefore, it is possible to prevent hydrogen from being bonded to the channel region A1. As a result, the effective length of the channel region A1 may be prevented from being shorter than the length of the channel region A1.

The channel region A1 may have a length of about 3 μm or less, and the channel region A1 may have short channel characteristics. By the above principle, the effective length of the channel region A1 may be maintained to be substantially the same as the length of the channel region A1 corresponding to the width of the first upper gate G1-1.

A first graph G10 in FIG. 7 shows a voltage-current curve of a transistor in which a metal oxide pattern MOP of FIG. 6 is not formed, and a second graph G20 in FIG. 7 shows a voltage-current curve of a first transistor T1 of FIG. 6. Measurement shows that a source S1 and a drain D1 of the transistor in which the metal oxide pattern MOP is not formed have a sheet resistance of about 217.75 Ω/sq, and a source S1 and a drain D1 of the transistor T1 of FIG. 6 have a sheet resistance of about 513.32 Ω/sq. Measurement shows that while the transistor in which the metal oxide pattern MOP is not formed has a driving voltage range DA10 ($V_{GS}$) of about 1.92 V, the first transistor T1 of FIG. 6 has a driving voltage range DA20 ($V_{G}$s) of about 2.1 V.

As described with reference to FIG. 6, it may be confirmed through FIG. 7 that since oxygen is injected in the process of forming the metal oxide pattern MOP, the resistances of the source S1 and the drain D1 of the first transistor T1 are increased, and the driving voltage range of the first transistor T1 becomes wider.

FIGS. 8A to 8F are schematic cross-sectional views illustrating manufacturing processes of a display panel DP according to an embodiment. Hereinafter, detailed description of the same configuration as a configuration described with reference to FIGS. 4 to 7 is omitted.

Figures 8A, 8B:
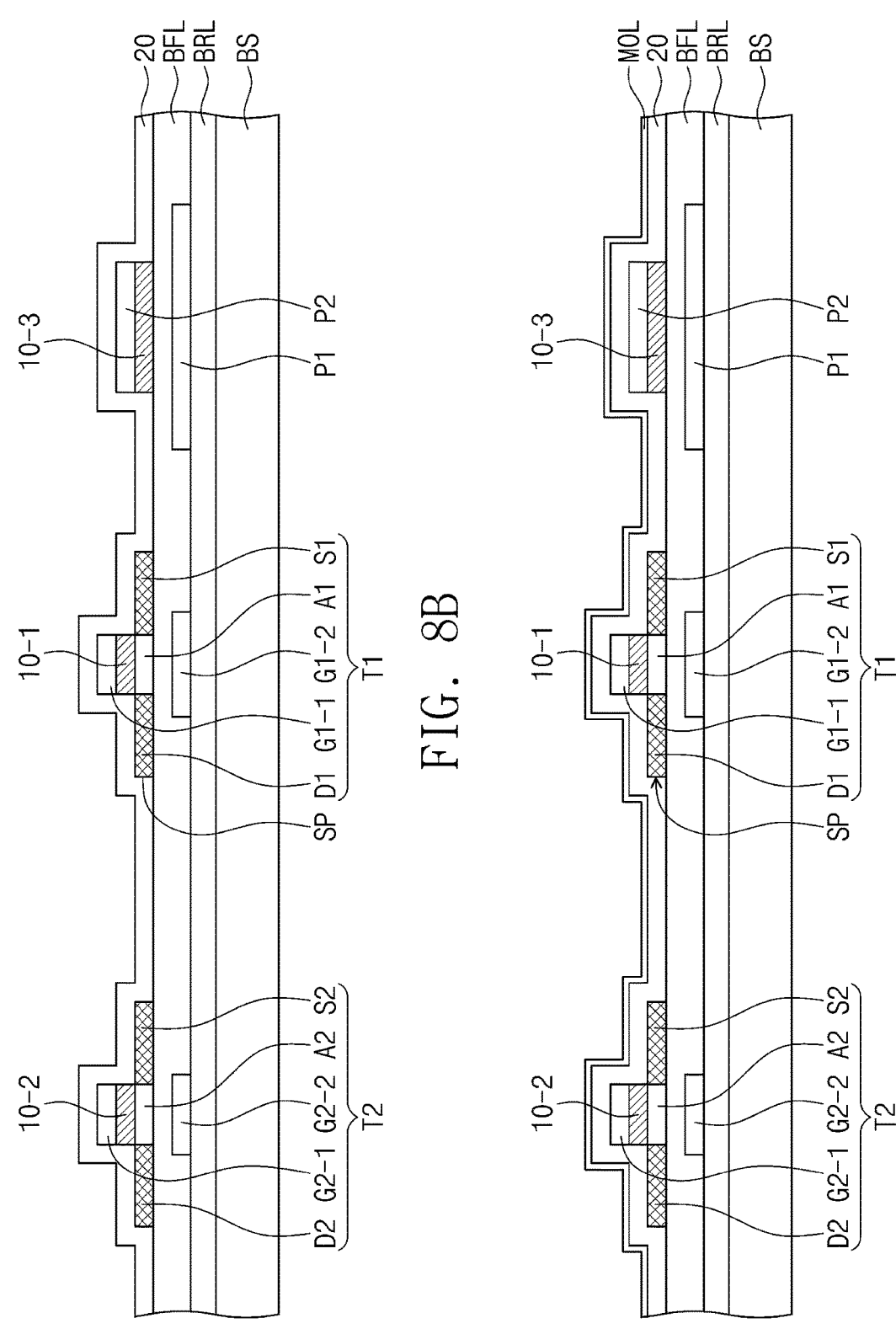

As illustrated in FIG. 8A, a first transistor T1 is formed on a base layer BS. As described with reference to FIG. 4, the first transistor T1 may include a first lower gate G1-2, a metal oxide semiconductor pattern SP, a first insulating pattern 10-1, and a first upper gate G1-1. A second transistor T2 may be formed through a same process as a process of forming the first transistor T1. A first conductive pattern P1 of a second capacitor C2 and the first lower gate G1-2 may be formed through a same process, and a second conductive pattern P2 of the second capacitor C2 and the first upper gate G1-1 may be formed through a same process.

A second insulating layer 20, which covers the first upper gate G1-1, a first source S1, and a first drain D1, is formed on the base layer BS. For example, an inorganic material may be deposited using plasma enhanced chemical vapor deposition (PECVD).

Thereafter, as illustrated in FIG. 8B, a metal oxide layer MOL is formed on the second insulating layer 20. The metal oxide layer MOL may be formed using sputtering or metal organic chemical vapor deposition (MOCVD). In the forming of the metal oxide layer MOL, a partial pressure of an oxygen gas with respect to a reaction gas may be in a range of about 50% to 100%. The reaction gas may further include a silane gas, a fluorosilane gas, a nitrogen dioxide gas, etc., within the spirit and the scope of the disclosure.

In the process of depositing the metal oxide layer MOL, oxygen (for example, oxygen radicals, oxygen atoms, or oxygen ions) may be supplied to the second insulating layer 20 by an oxygen plasma, and may diffuse to the metal oxide semiconductor pattern SP through a heat-treatment process.

Thereafter, as illustrated in FIG. 8C, a conductive pattern P3 is formed on the metal oxide layer MOL. After forming the conductive layer, the conductive layer is patterned through a photolithography process and an etching process. In an embodiment, a process of forming the third conductive pattern P3 overlapping the first upper gate G1-1 may be omitted.

Thereafter, as illustrated in FIG. 8D, the metal oxide layer MOL is patterned using the conductive pattern P3 as a mask. The metal oxide layer MOL may be patterned through a wet etching process. The metal oxide pattern MOP aligned with the conductive pattern P3 may be formed from the metal oxide layer MOL. An edge of the metal oxide pattern MOP and an edge of the conductive pattern P3 may be aligned.

In case that the conductive pattern P3 is not formed, the metal oxide layer MOL may be patterned using a separate mask pattern. A photoresist pattern may be used as the mask pattern.

In case that the conductive pattern P3 is not formed, the metal oxide layer MOL may be completely removed. Since oxygen has been already supplied to the second insulating layer 20 in the forming of the metal oxide layer MOL, the resistances of the first source S1 and the first drain D1 may be controlled, as described with reference to FIG. 6, although the metal oxide layer MOL is completely removed. In case that the metal oxide pattern MOP remains, oxygen may additionally further diffuse from the metal oxide pattern MOP to the metal oxide semiconductor pattern SP during subsequent processes.

Figure 8E:
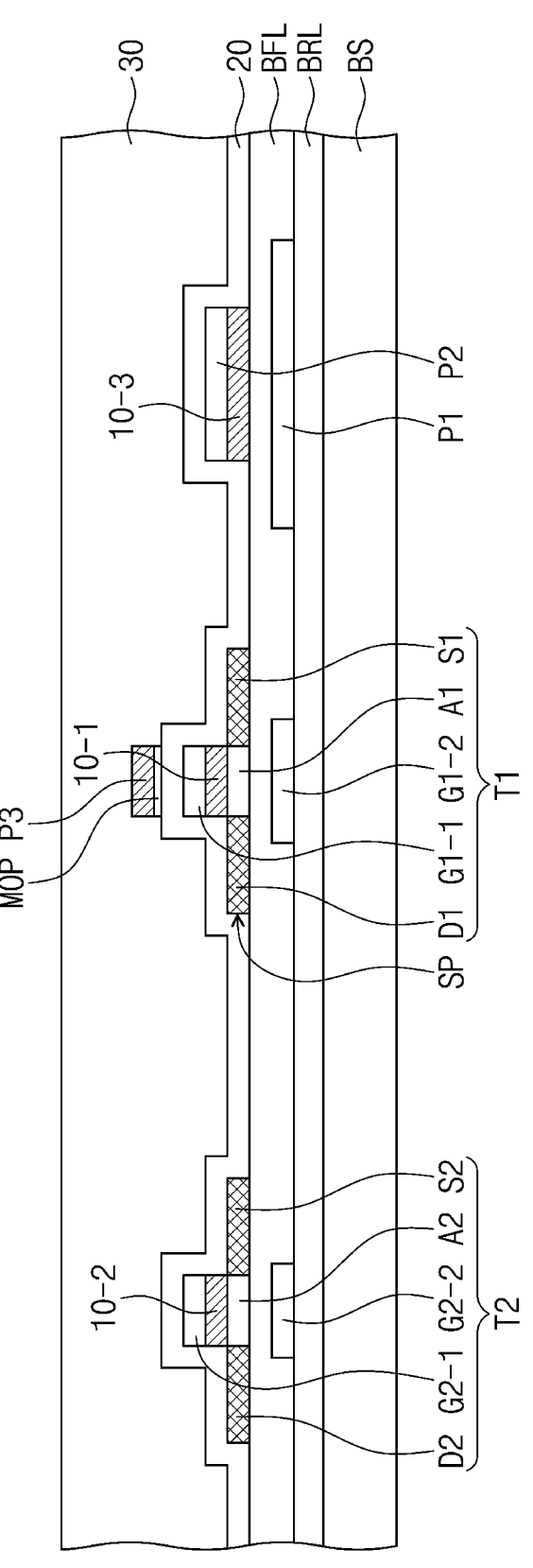

Thereafter, as illustrated in FIG. 8E, a third insulating layer 30 is formed on the second insulating layer 20. As illustrated in FIG. 6, a silicon oxynitride layer and a silicon nitride layer may be sequentially formed using plasma enhanced chemical vapor deposition (PECVD).

Figure 8F:
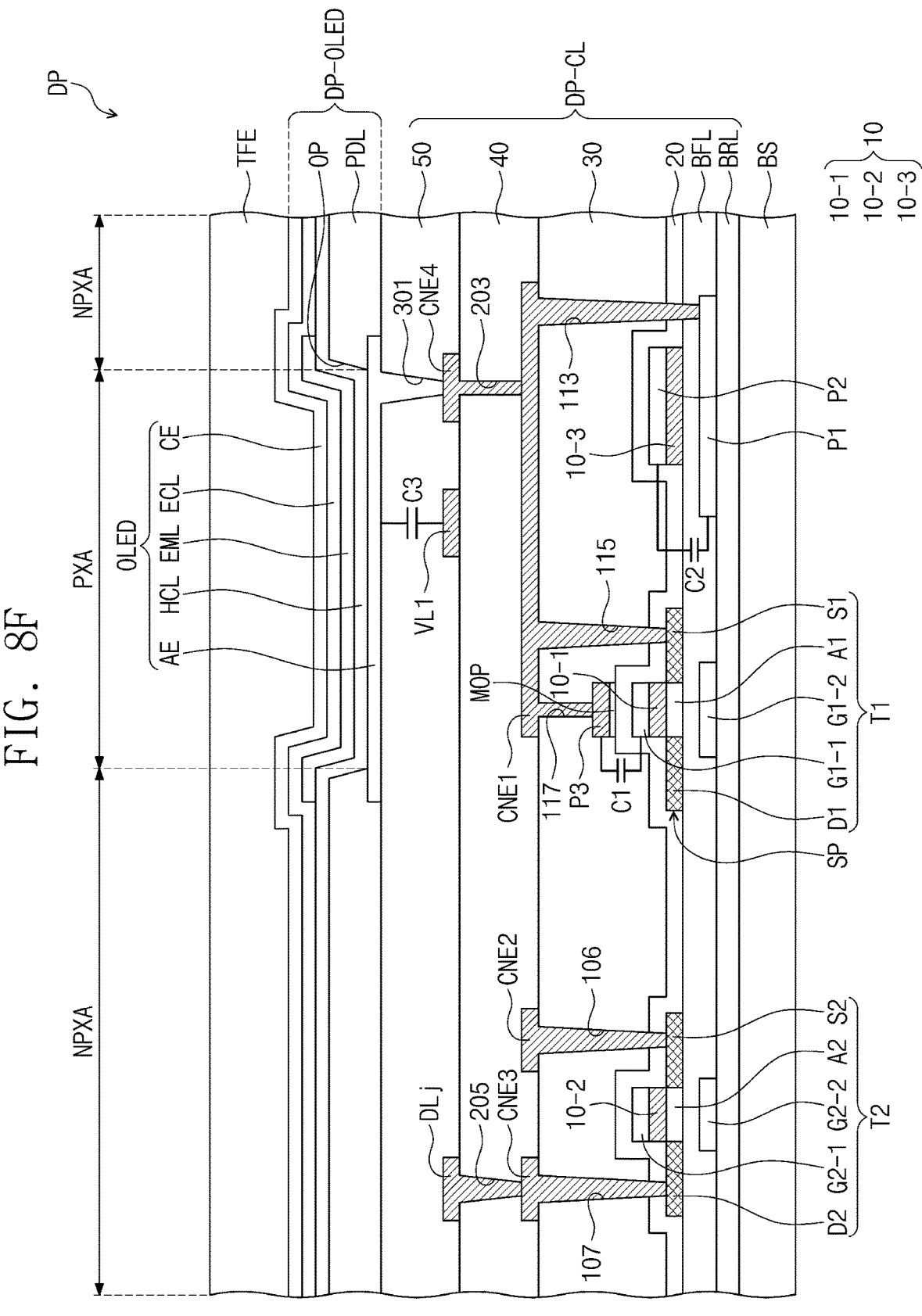

Thereafter, as illustrated in FIG. 8F, a light-emitting element OLED is formed on the third insulating layer 30. Contact holes 106, 107, 113, 115, and 117 are formed through a photolithography process and an etching process. Thereafter, first to third connection electrodes CNE1, CNE2, and CNE3 are formed by forming a metal layer and patterning the metal layer.

Thereafter, a process of forming an insulating layer and a process of forming a conductive pattern are repeated. A fourth insulating layer 40 is formed, and a data line DLj, a first voltage line VL1, and a fourth connection electrode CNE4 are formed. A fifth insulating layer 50 is formed on the fourth insulating layer 40. Thereafter, the light-emitting element OLED is formed on the fifth insulating layer 50.

Figure 9:
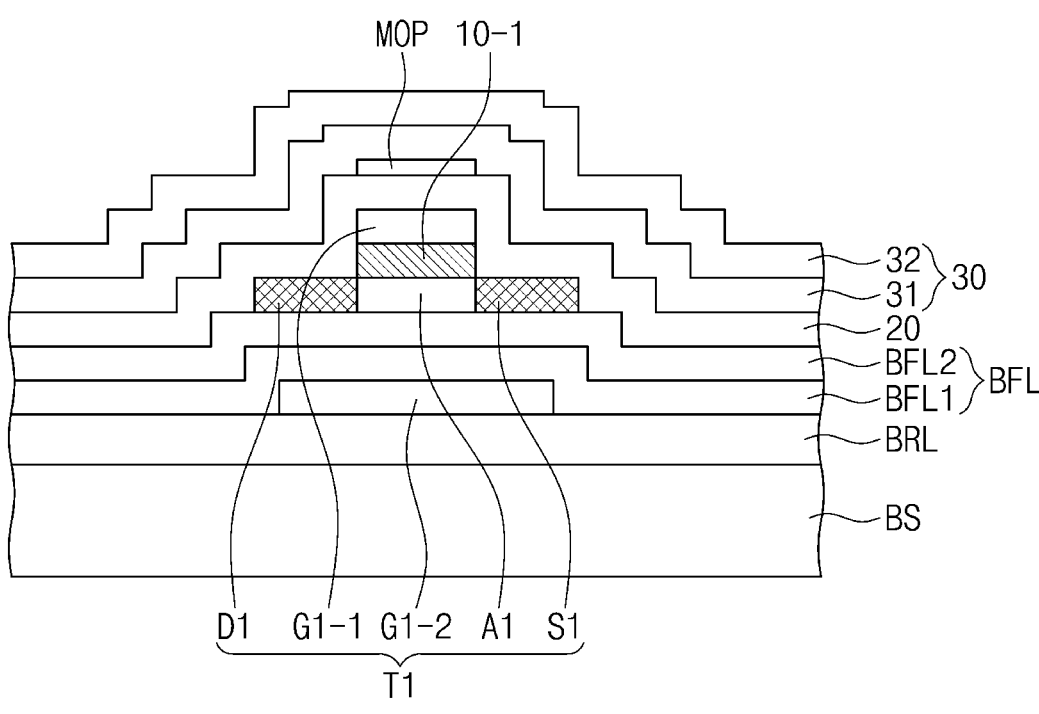
FIG. 9 is an enlarged schematic cross-sectional view of a first transistor according to an embodiment.

FIG. 9 is an enlarged schematic cross-sectional view of a first transistor T1 according to an embodiment. Hereinafter, detailed description of the same configuration as the first transistor T1 described with reference to FIG. 6 is omitted.

According to an embodiment, unlike what is illustrated in FIG. 6, a third conductive pattern P3 is omitted. A metal oxide pattern MOP may be formed by patterning a metal oxide layer using an additional mask pattern.

The metal oxide pattern MOP may be a floating pattern, or may correspond to a second electrode E1-2 of a first capacitor C1, like the third conductive pattern P3. The metal oxide pattern MOP may be reduced in the process of forming the third inorganic layer 30 to have a decreased resistance, and may serve as an electrode.

Figure 10:
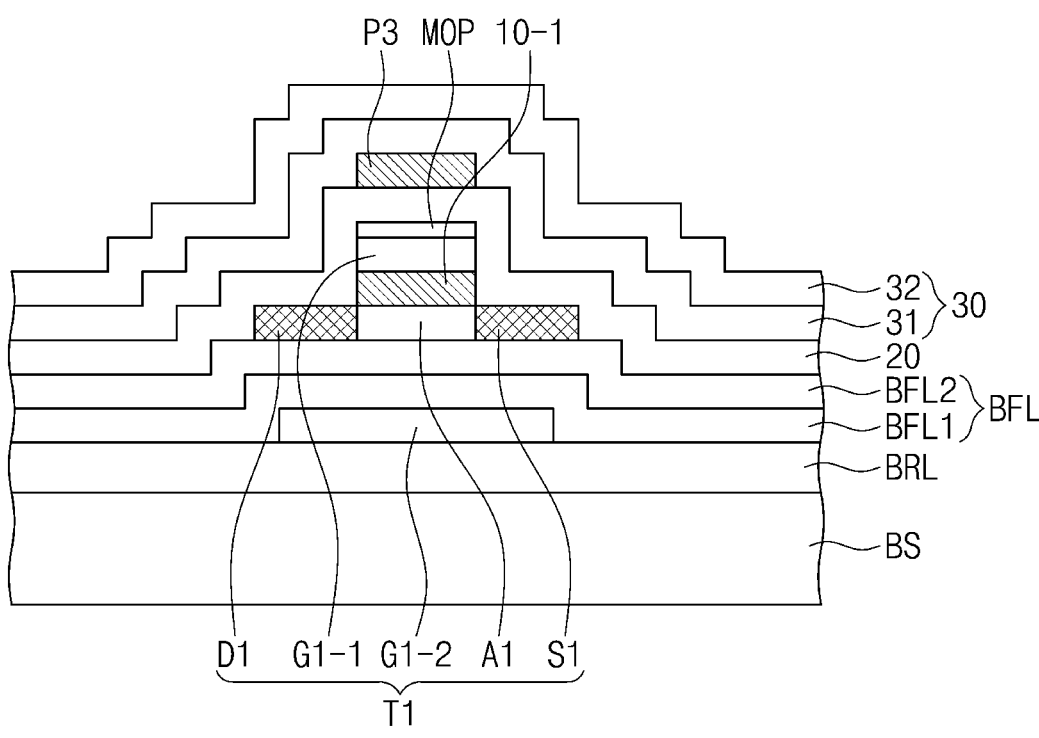
FIG. 10 is an enlarged schematic cross-sectional view of a first transistor according to an embodiment.

FIG. 10 is an enlarged schematic cross-sectional view of a first transistor according to an embodiment. FIGS. 11A to 11F are schematic cross-sectional views illustrating manufacturing processes of a display panel according to an embodiment. Hereinafter, detailed description of the same configuration as the first transistor T1 described with reference to FIGS. 1 to 9 is omitted.

As illustrated in FIG. 10, a metal oxide pattern MOP may be disposed on an upper surface of a first upper gate G1-1. The metal oxide pattern MOP may be in contact with the upper surface of the first upper gate G1-1. A second insulating layer 20 may cover the metal oxide pattern MOP in a region overlapping the first upper gate G1-1. A third conductive pattern P3 may be disposed on the second insulating layer 20.

Figure 11A:
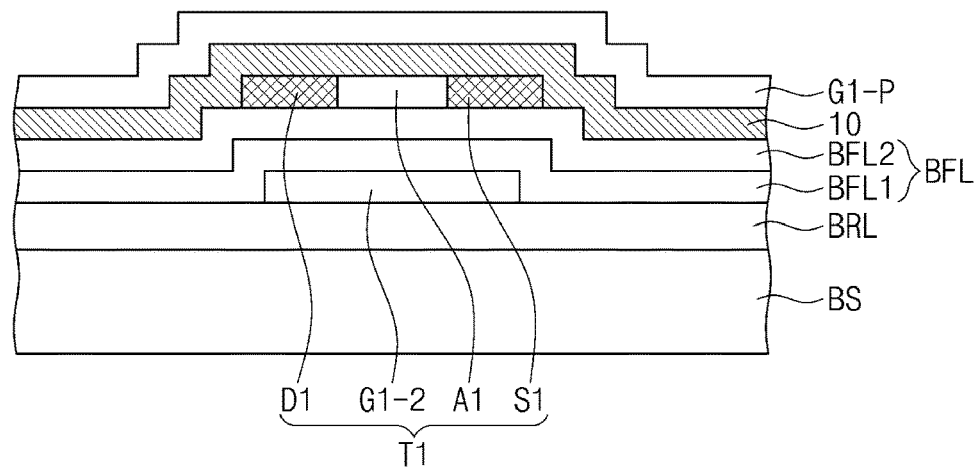
FIGS. 11A to 11F are schematic cross-sectional views illustrating manufacturing processes of a display panel according to an embodiment.

As illustrated in FIG. 11A, a metal oxide semiconductor pattern SP is formed on a base layer BS. Thereafter, a first insulating layer 10 and a metal layer G1-P are formed on a buffer layer BFL.

Figure 11B:
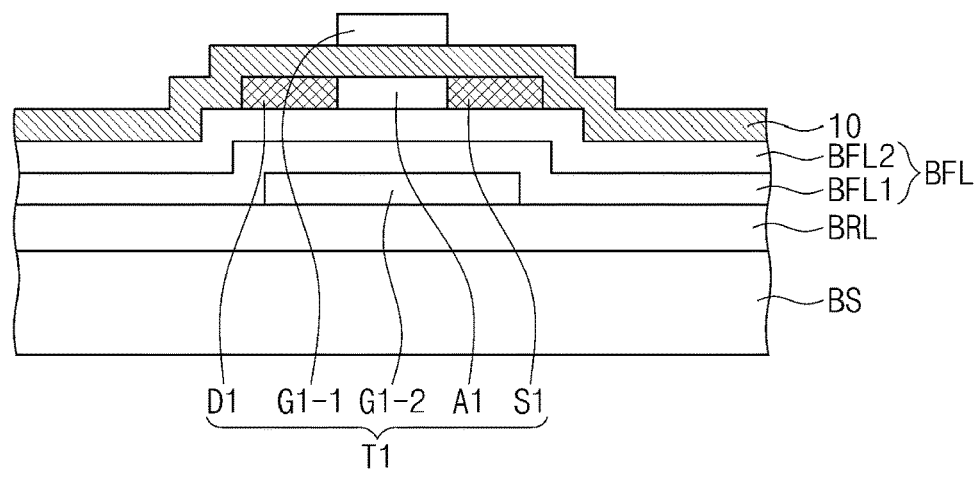

As illustrated in FIG. 11B, a first upper gate G1-1 is formed from the metal layer G1-P through a photolithography process and an etching process.

Figure 11C:
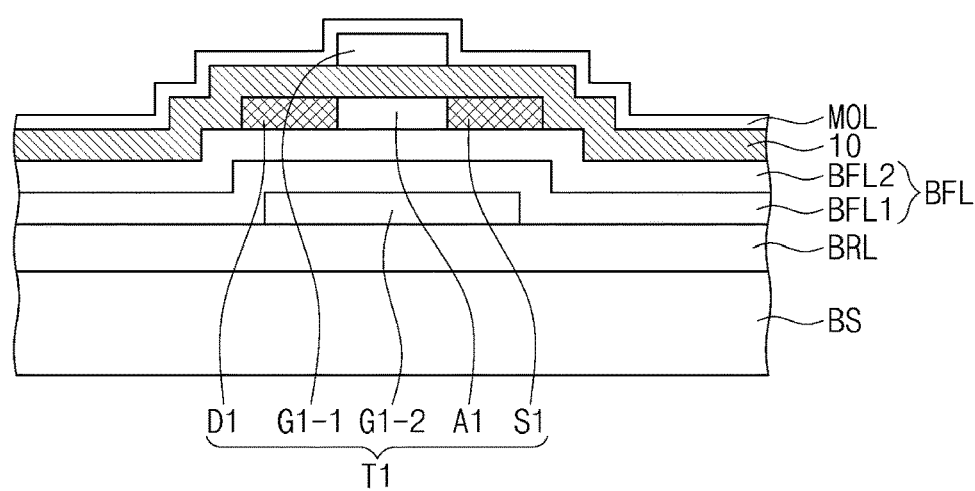

As illustrated in FIG. 11C, a metal oxide layer MOL which covers the first upper gate G1-1 is formed on the first insulating layer 10. Oxygen may be supplied to the first insulating layer 10 in the process of forming the metal oxide layer MOL, and may be injected to regions exposed from the first upper gate G1-1 of the metal oxide semiconductor pattern SP through a heat-treatment process.

Figure 11D:
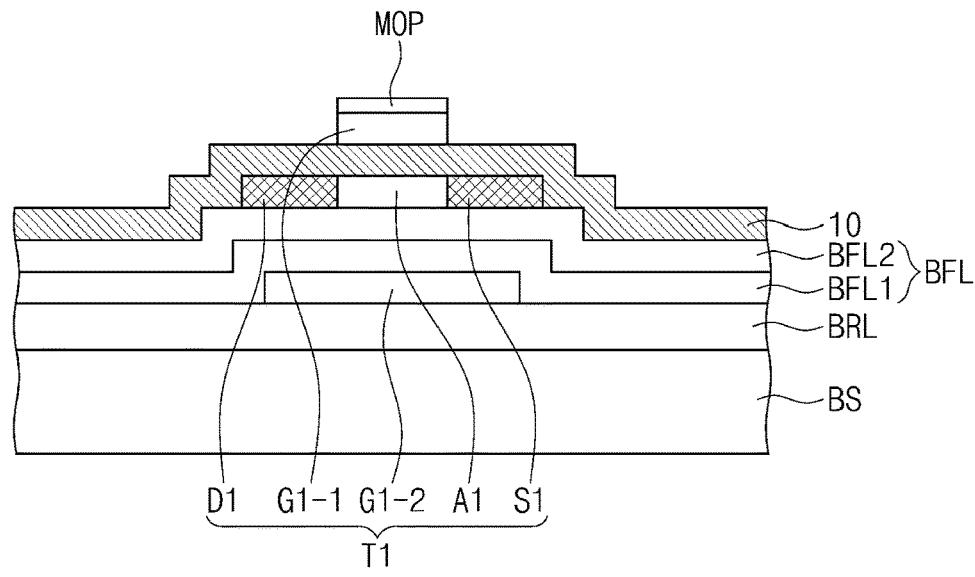

As illustrated in FIG. 11D, a metal oxide pattern MOP is formed from the metal oxide layer MOL through a photolithography process and an etching process. According to an embodiment, the metal oxide layer MOL may be entirely removed.

Figure 11E:
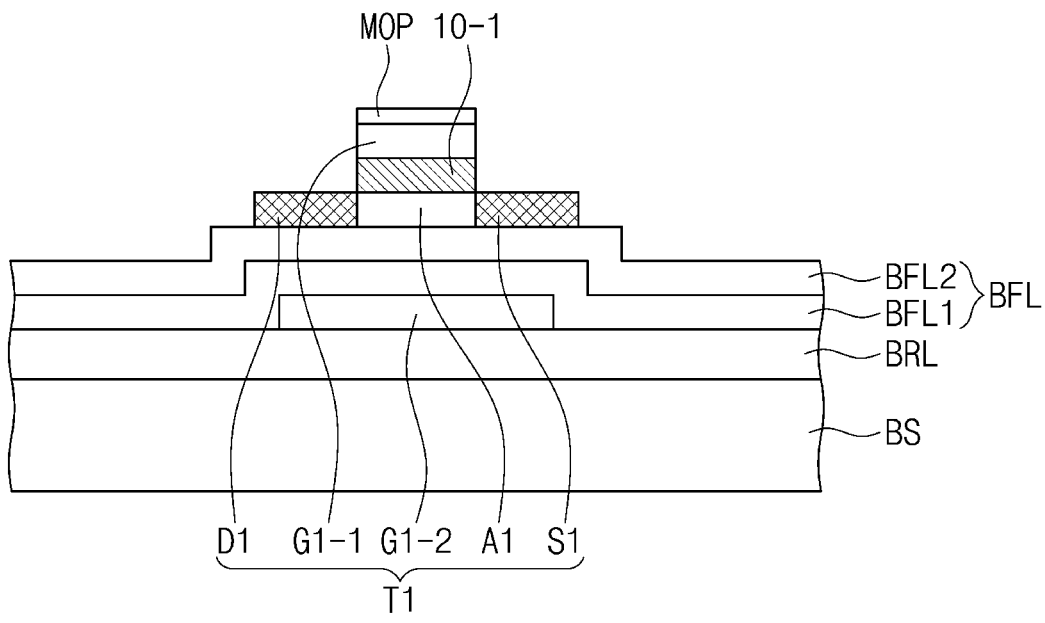

As illustrated in FIG. 11E, a first insulating pattern 10-1 is formed from the first insulating layer 10 through an etching process. In the etching process of FIG. 11E, the first upper gate G1-1 may be used as a mask. In an embodiment, the process of patterning the first insulating layer 10 may be omitted. The first insulating pattern 10-1 may entirely cover the metal oxide semiconductor pattern SP.

Figure 11F:
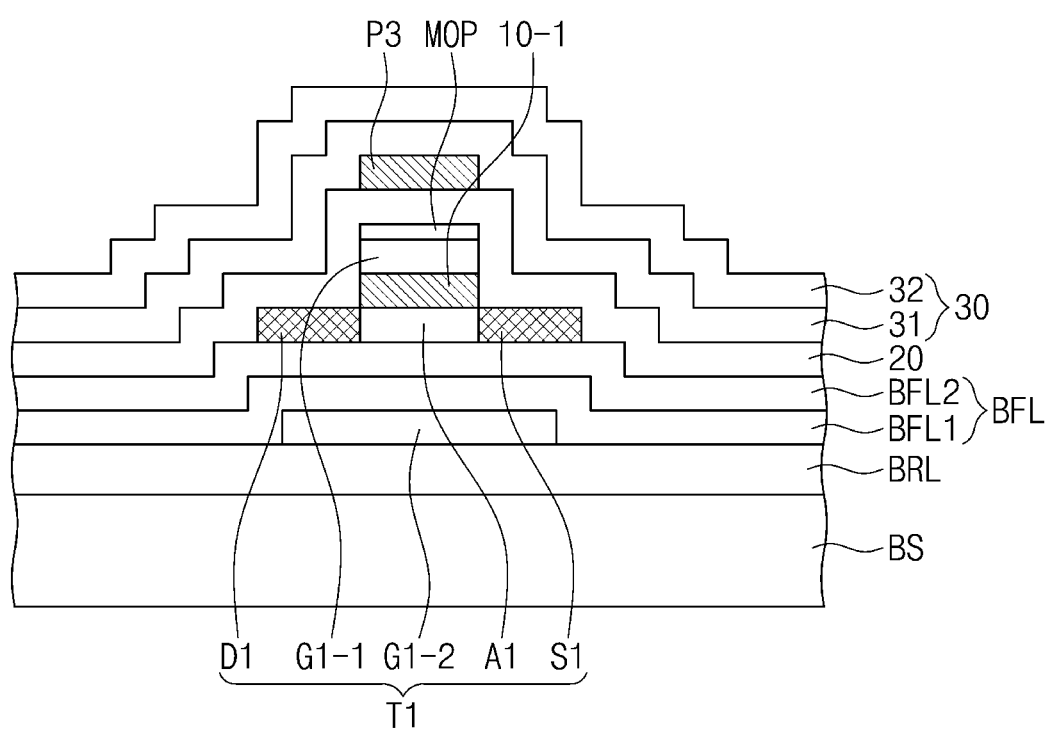

As illustrated in FIG. 11F, a third insulating layer 30 is formed on the second insulating layer 20. A silicon oxynitride layer 31 and a silicon nitride layer 32 may be sequentially formed using plasma enhanced chemical vapor deposition (PECVD). FIGS. 11A to 11F describe manufacturing processes of a display panel while focusing on the first transistor T1, but post processes may be additionally performed. Since the post processes are the same as those described with reference to FIGS. 8E and 8F, detailed description thereof is omitted.

According to what is described above, in the forming of a metal oxide pattern, oxygen is injected onto an insulating layer which covers a metal oxide semiconductor pattern. The oxygen diffuses to a source region and a drain region of the metal oxide semiconductor pattern, and reduces carriers in the source region and the drain region. The resistances of the source region and the drain region with reduced carriers increase, thus causing the voltage-current characteristics of an oxide transistor to be changed. The oxide transistor may have a wider driving voltage range.

The injected oxygen may diffuse to a channel region. By way of example, the oxygen may diffuse to an edge region of the channel region exposed by a gate. The diffused oxygen removes oxygen deficiency in the edge region of the channel region. Since oxygen deficiency is removed and hydrogen bonded thereto is reduced, a carrier concentration in an external region of the channel region is not increased. For example, channel characteristics in the edge region of the channel region are maintained, and an effective length of the channel region is maintained to be substantially the same as the length of the channel region.

In the above, description has been made with reference to embodiments, but those skilled in the art or those of ordinary skill in the relevant technical field will understand that various modifications and changes may be made to the disclosure without departing from the spirit and scope of the disclosure described in the claims.

Therefore, the scope of the disclosure is not limited to the contents described in the detailed description of the specification, but should also be determined by the claims.

What is claimed is:

1. A display device comprising:
insulating layers;
a light-emitting element; and
a pixel circuit electrically connected to the light-emitting element, wherein
the pixel circuit comprises a first transistor, and
the first transistor comprises:
a metal oxide semiconductor pattern including a source region, a drain region and a channel region disposed between the source region and the drain region,
a first gate disposed on the metal oxide semiconductor pattern, and overlapping the channel region in a plan view, and
a metal oxide pattern disposed on the first gate, wherein
the display device further comprises a connection electrode connected to the source region and to the metal oxide pattern.

2. The display device of claim 1, wherein the insulating layers comprise:
a first insulating layer disposed between the channel region and the first gate;
a second insulating layer having a first portion disposed between the first gate and the metal oxide pattern, a second portion disposed on the source region, and a third portion disposed on the drain region; and
a third insulating layer disposed on the second insulating layer and the metal oxide pattern.

3. The display device of claim 2, wherein
the first insulating layer comprises a first silicon oxide layer,
the second insulating layer comprises a second silicon oxide layer or a first silicon oxynitride layer, and
the third insulating layer comprises a second silicon oxynitride layer and a first silicon nitride layer disposed on the second silicon oxynitride layer.

4. The display device of claim 2, wherein the second insulating layer covers a side surface of the first insulating layer.

5. The display device of claim 1, wherein the metal oxide pattern electrically contacts an upper surface of the first gate.

6. The display device of claim 1, wherein the pixel circuit further comprises a conductive pattern disposed on the metal oxide pattern.

7. The display device of claim 6, wherein a corresponding insulating layer among the insulating layers is disposed between the first gate and the conductive pattern, and the first gate and the conductive pattern define a capacitor.

8. The display device of claim 1, wherein the first transistor is configured to control a driving current of the light-emitting element based on a charged capacitance of a capacitor defined by the first gate and a conductive pattern on the metal oxide pattern.

9. The display device of claim 1, wherein the pixel circuit further comprises a second transistor, the second transistor comprises a second metal oxide semiconductor pattern, and the second transistor is configured to supply a data voltage to a capacitor defined by the first gate and a conductive pattern on the metal oxide pattern.

10. The display device of claim 1, wherein an edge of the metal oxide pattern is aligned with an edge of a conductive pattern on the metal oxide pattern.

11. The display device of claim 1, wherein the channel region has a length of about 3 μm or less.

12. The display device of claim 1, wherein the first transistor further comprises a second gate electrically connected to the first gate and disposed below the metal oxide semiconductor pattern.

13. The display device of claim 1, wherein the metal oxide pattern comprises at least one of indium (In), tin (Sn), zinc (Zn), gallium (Ga), magnesium (Mg), hafnium (Hf), and titanium (Ti).

14. The display device of claim 13, wherein the metal oxide pattern comprises at least one of tin (Sn), magnesium (Mg), and hafnium (Hf).

15. The display device of claim 1, wherein the metal oxide pattern has a thickness in a range of about 100 Å to about 300 Å.

16. The display device of claim 1, wherein the connection electrode includes:

a first contact directly connected to the source region;

a second contact connected to the metal oxide pattern; and a metal runner directly connected to an upper surface of the first contact and to an upper surface of the second contact.

17. The display device of claim 16, further comprising:

a first conductive pattern;

a second conductive pattern on the first conductive pattern; and a dielectric pattern between the first conductive pattern and the second conductive pattern, wherein the connection electrode further includes a third contact connected to the first conductive pattern, an upper surface of the third contact directly connected to the metal runner.

18. The display device of claim 17, further comprising:

a conformal insulating layer on the second conductive pattern and between the metal oxide pattern and the first gate; and an interlayer insulating layer directly on an upper surface of the conformal insulating layer.

19. The display device of claim 1, further comprising:

a conformal insulating layer between the metal oxide pattern and the first gate, wherein a thickness of the metal oxide pattern is thinner than a thickness of the conformal insulating layer.

* * * * *